(12) United States Patent
Shih et al.

(10) Patent No.: US 12,708,045 B2
(45) Date of Patent: Aug. 11, 2026

(54) METHOD AND STRUCTURE FOR A THREE-DIMENSIONAL PACKAGE

(71) Applicant: Taiwan Semiconductor Manufacturing Co., Ltd., Hsinchu (TW)

(72) Inventors: Chao-Wen Shih, Zhubei (TW); Min-Chien Hsiao, Taichung (TW); Kuo-Chiang Ting, Hsinchu (TW); Yen-Ming Chen, Chu-Pei (TW); Ashish Kumar Sahoo, Hsinchu (TW); Chen-Sheng Lin, Taoyuan (TW); Hsin-Yu Pan, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 422 days.

(21) Appl. No.: 18/328,430

(22) Filed: Jun. 2, 2023

(65) Prior Publication Data

US 2024/0404991 A1 Dec. 5, 2024

(51) Int. Cl.
*H01L 23/48* (2006.01)
*H01L 23/52* (2006.01)
(Continued)

(52) U.S. Cl.
CPC ......... *H10W 90/00* (2026.01); *H10W 74/019* (2026.01); *H10W 74/111* (2026.01);
(Continued)

(58) Field of Classification Search
CPC . H01L 25/0652; H01L 23/3107; H01L 24/08; H01L 25/0657; H01L 2224/08145; H01L 2225/06541; H01L 2224/08; H01L 24/05; H01L 2224/80001; H01L 2224/16; H01L 2224/73204; H01L 2224/09517; H01L 2224/0401; H01L 2224/80948; H01L 24/06; H01L 2225/06513; H01L 2225/06586; H01L 2224/08146; H01L 24/96; H01L 2224/16227; H01L 2924/181; H01L 2224/16145; H01L 2224/80896; H01L 2224/05009; H01L 2224/06051; H01L 2225/1058; H01L 2224/80201; H01L 2224/80907; H01L 23/53295; H01L 2224/05008; H01L 2224/05569; H01L 2225/06548; H01L 2225/06582; H01L 2224/1703; H01L 2224/32145;
(Continued)

(56) References Cited

U.S. PATENT DOCUMENTS

| | | | | |
|---|---|---|---|---|
| 2017/0250160 A1* | 8/2017 | Wu | ........................ | H10W 90/00 |
| 2022/0301981 A1 | 9/2022 | Chang et al. | | |
| 2023/0067714 A1 | 3/2023 | Chang et al. | | |

* cited by examiner

*Primary Examiner* — Niki H Nguyen
(74) *Attorney, Agent, or Firm* — Slater Matsil, LLP

(57) ABSTRACT

Embodiments include methods of forming three-dimensional packages and the packages resulting therefrom. The packages may utilize a bridge die to electrically connect one die to another die and at least one additional die adjacent to the bridge die. The height-to-width ratio of the gap between the bridge die and the at least one additional die is controlled by thinning the bridge die to be thinner than the at least one additional die. The packages may utilize landing structures to adjoin a dielectric material of an attached die to a metallic landing structure of a base die.

20 Claims, 36 Drawing Sheets

(51) Int. Cl.
*H01L 29/40* (2006.01)
*H10W 74/01* (2026.01)
*H10W 74/10* (2026.01)
*H10W 90/00* (2026.01)
*H10W 80/00* (2026.01)

(52) U.S. Cl.
CPC ........ *H10W 80/312* (2026.01); *H10W 80/327* (2026.01); *H10W 90/792* (2026.01)

(58) Field of Classification Search
CPC . H01L 2224/80203; H01L 2224/08058; H01L 2224/08237; H01L 2224/16146; H01L 2224/16148; H01L 2224/16238; H01L 2224/48145; H01L 24/71; H01L 24/73; H01L 25/0655; H01L 24/14; H01L 24/10; H01L 2224/08121; H01L 2224/08137; H01L 2224/12105; H01L 2224/24145; H01L 24/02; H01L 2224/05548; H01L 2224/0603; H01L 2224/0812; H01L 2224/32221; H01L 2224/32137; H01L 2225/06503; H01L 23/49513; H01L 2924/1441; H01L 2924/1437
See application file for complete search history.

20/20e
202d
20/20b
202c
105b
20/20d
105a
202a
18
200ls
20e
20r
20c
200bp
20b
20d
14
122
154
116
130
138
12
10
20/20e
20/20b 18
20/20e
202a
20/20b
200ls
20e
20r
20c
200bp
20b
20d
105a
20/20d
202c
105b
202d 205
305
205
105a
105b
20/20c
20/20c
20/20c
20/20c
200ls
20e
20r
20c
200bp
20b
20d
18

205
305
205
105a
105b
200bp
20b
20d
18

154e
205b
154e
154e
205a
154b
154d
154bp
154e
154r
154c
154ls
154e
152

205b
154e
154e
205a
154b
154d
154bp
154e
154r
154c
154ls
154e
152

METHOD AND STRUCTURE FOR A THREE-DIMENSIONAL PACKAGE

BACKGROUND

The packages of integrated circuits are becoming increasing complex, with more device dies packaged in the same package to achieve more functions. For example, System on Integrate Chip (SoIC) has been developed to include a plurality of device dies such as processors and memory cubes in the same package. The SoIC can include device dies formed using different technologies and have different functions bonded to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
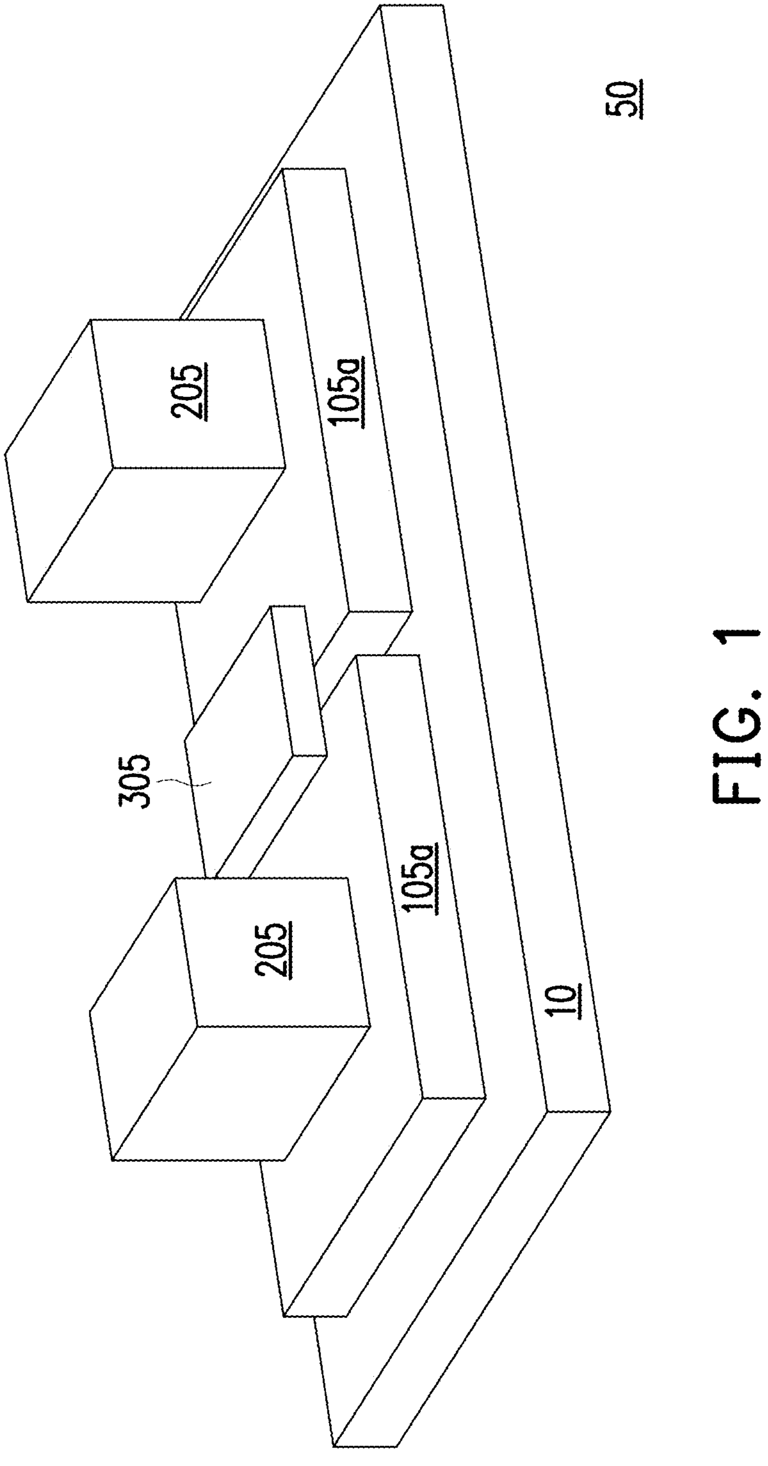
FIG. 1 illustrates a perspective view of a package structure in an intermediate step in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three dimensional packaged devices may utilize chip stacking or chip-on-wafer stacking to achieve greater functionality in a smaller overall footprint. Bonding chips to other chips or other wafers may utilize direct bonding methods where bond pads from a first device are pressed to bond pads of a second device and a dielectric layer of the first device is pressed to a dielectric layer of the second device. Through pressure and an annealing process, the dielectric layers are fused or bonded together—forming fusion bonds across the interface and bond pads are bonded together by interdiffusion of their materials. One challenge that is faced when bonding devices together is warpage. Devices may experience different warpage characteristics and the direct bonding techniques may fail due to warpage pressure, causing peeling or voids. Embodiments provide a direct bonding technique to increase the bonding interface strength where a dielectric material along an edge of a top die is adjoined to dummy bond pads of the lower die or wafer. Adjoining the dummy bond pads, which are metallic, to a dielectric material is accomplished through several mechanisms, discussed in further detail below. These metal-dielectric bonds may be located at the edges and/or corners of the top die which are the portions of the top die most susceptible to peeling or other warpage-induced failures.

Bridge dies may be used to electrically couple metal features from one device to another device. For example, a bridge die may provide an electrical path from a first external connector of the bridge die to a second external connector of the bridge die. The first connector may then be connected, for example, to the first device and the second connector may be connected to the second device, thereby forming an electrically conductive bridge between the first device and the second device. One issue with such a bridge die interconnect is that, in devices with multiple top device dies, the thickness of the dies along with the spacing of the dies may result in openings therebetween with such a height-to-width ratio that it is difficult to reliably deposit an encapsulant between the bridge die and the top device dies. For example, when the spacing is between about 50 μm and 100 μm and the thickness of the bridge die and device dies is between 200 μm and 500 μm, then the combination of a height-to-width ratio between 4:1 and 10:1 and a relatively deep opening of between 200 μm and 500 μm may cause insufficient deposition of encapsulant. Embodiments utilize a bridge die which is much thinner than the device dies, which effectively brings the height-to-width ratio down to between 1:5 and 1:3, as measured to the lesser height of the bridge die.

The embodiments discussed herein are discussed in the context of a three-dimensional package, such as a System on Integrate Chip (SoIC) package and the method of forming the same, although it should be understood that the disclosed techniques and devices may be used in other packaging contexts. The intermediate stages of forming the SoIC package are illustrated in accordance with some embodiments. Some variations of some embodiments are discussed. Throughout the various views and illustrative embodiments, like reference numbers are used to designate like elements. It is appreciated that although the formation of SoIC packages is used as examples to explain the concept of the embodiments of the present disclosure, the embodiments of the present disclosure are readily applicable to other bonding methods and structures in which metal pads and vias are bonded to each other.

FIG. 1 illustrates a perspective view of an SoIC package device 50 in an intermediate step in accordance with some embodiments. Some details have been omitted for clarity. While some examples of types of dies 105 and 205 are listed below, the dies 105 and 205 may be any dies. The die 105 may be a logic die, such as a Central Processing Unit (CPU) die, a Micro Control Unit (MCU) die, an input-output (IO) die, a BaseBand (BB) die, an Application processor (AP) die, or the like. The die 105 may also be a memory die such as a Dynamic Random Access Memory (DRAM) die or a Static Random Access Memory (SRAM) die, or the like. The die 105 may be part of a wafer (see FIG. 2). In some embodiments, the dies 205 may be attached to a wafer that is later singulated (see, e.g., FIGS. 20A and 20B through 25. The die 205 is electrically bonded to the die 105. The die 205 may be a logic die, which may be a CPU die, MCU die, IO die, Base-Band die, or AP die. The die 205 may also be a memory die. Multiple dies 205 may be bonded to the die 105, each one having different and/or similar functionalities.

The bridge die 305 is bonded to a first die 105*a* and a second die 105*b* and bridges a connection between the first die 105*a* and the second die 105*b*. It should be appreciated that in some embodiments, multiples of the bridge dies 305 may be used in various combinations with multiple dies 105.

Figure 2:
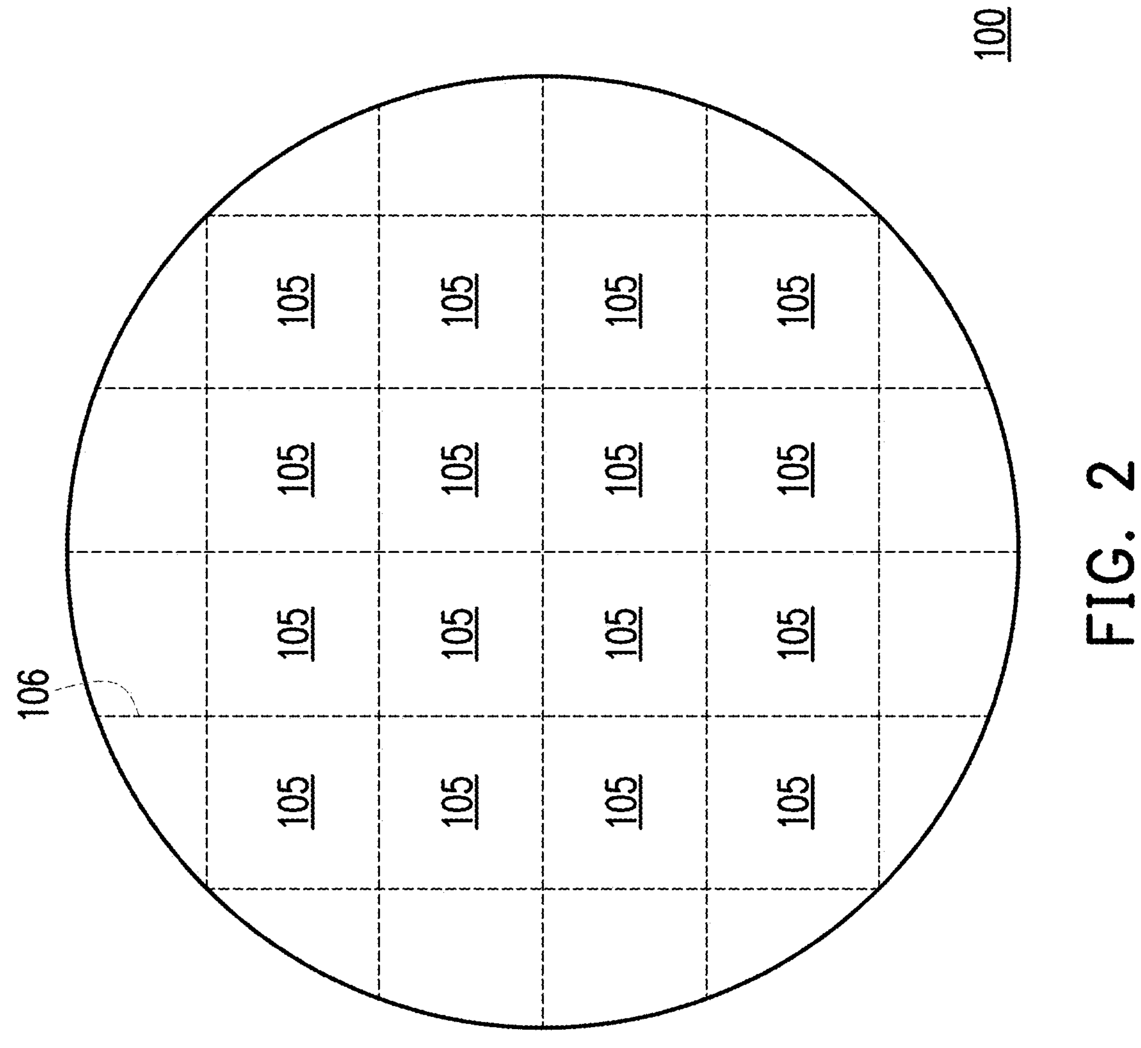
FIG. 2 illustrates a top down view of a package component with multiple device dies defined within.

FIG. 2 illustrates a wafer 100 (or, more generally a package component, of which an example wafer is provided, as illustrated) with multiple dies 105 defined or formed within. The dies 105 may all be of the same design and function or may be of different designs and functions. The dashed lines represent dicing lines 106 where the dies 105 will be separated from each other in a subsequent singulation process.

Figure 3:
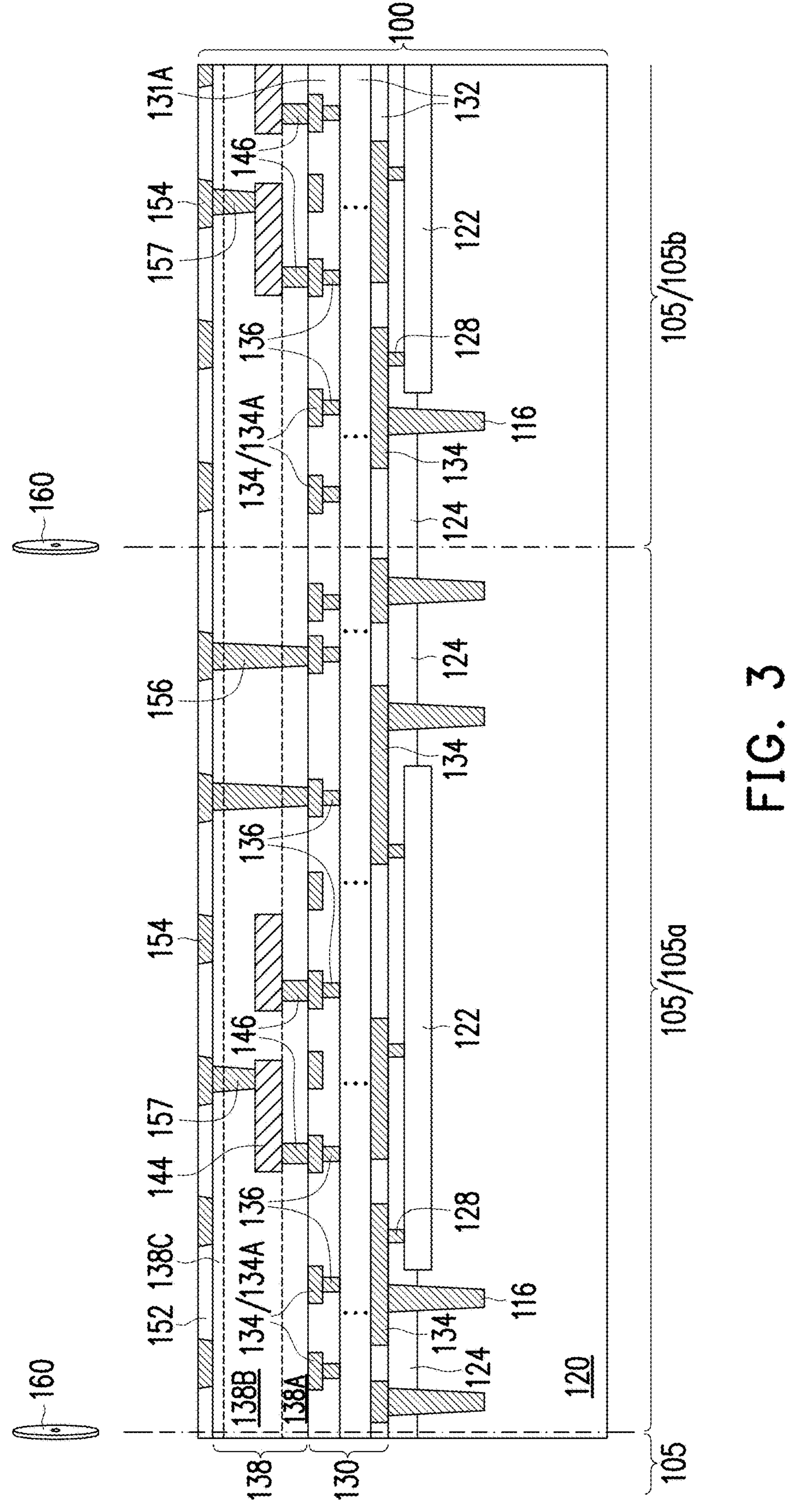
FIGS. 3 through 4 illustrate cross-sectional views of intermediate stages in the formation of a package component in accordance with some embodiments of the present disclosure.

FIGS. 3 through 6 illustrate cross-sectional views of intermediate stages in the formation of an SoIC package in accordance with some embodiments of the present disclosure. FIG. 3 illustrates a partial cross-sectional view of wafer 100. In accordance with some embodiments of the present disclosure, wafer 100 is a device wafer including integrated circuit devices 122, e.g., active devices such as transistors and/or diodes, and possibly passive devices such as capacitors, inductors, resistors, or the like. In accordance with other embodiments of the present disclosure, wafer 100 includes passive devices (with no active devices). Wafer 100 may include a plurality of package device areas therein, which are to be singulated from the wafer 100 in a singulation process to form the dies 105. These package device areas are referred to as dies 105. The wafer 100, as illustrated, incudes a portion of die 105*a* and a portion of die 105*b*. The dies 105 may be integrated circuit dies, passive dies, interposers, etc. It should be understood that these views are merely illustrative and not limiting.

In accordance with some embodiments of the present disclosure, the wafer 100 includes semiconductor substrate 120 and the features formed at a top surface of semiconductor substrate 120. Semiconductor substrate 120 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. Semiconductor substrate 120 may also be a bulk silicon substrate or a Silicon-On-Insulator (SOI) substrate. Shallow Trench Isolation (STI) regions (not shown) may be formed in semiconductor substrate 120 to isolate the active regions in semiconductor substrate 120. Optional through-vias 116 may be formed to extend into semiconductor substrate 120, and the optional through-vias 116 may be used to electrically inter-couple features on opposite sides of wafer 100.

In accordance with some embodiments of the present disclosure, wafer 100 includes integrated circuit devices 122, which are formed on the top surface of semiconductor substrate 120. Example integrated circuit devices 122 may include Complementary Metal-Oxide Semiconductor (CMOS) transistors, resistors, capacitors, diodes, and/or the like. The details of integrated circuit devices 122 are not illustrated herein. In accordance with other embodiments, wafer 100 is used for forming interposers, in which semiconductor substrate 120 may be a semiconductor substrate or instead of a semiconductor substrate, a dielectric substrate.

Inter-Layer Dielectric (ILD) 124 is formed over semiconductor substrate 120, and fills the space between the gate stacks of transistors (not shown) in integrated circuit devices 122. In accordance with some embodiments, ILD 124 is formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS) formed silicon oxide, or the like. ILD 124 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs 128 are formed in ILD 124, and are used to electrically connect integrated circuit devices 122 to overlying metal lines 134 and vias 136. In accordance with some embodiments of the present disclosure, contact plugs 128 are formed of a conductive material selected from tungsten, aluminum, copper, titanium, tantalum, titanium nitride, tantalum nitride, alloys therefore, and/or multi-layers thereof. The formation of contact plugs 128 may include forming contact openings in ILD 124, filling a conductive material(s) into the contact openings, and performing a planarization (such as Chemical Mechanical Polish (CMP) process) to level the top surfaces of contact plugs 128 with the top surface of ILD 124.

Over ILD 124 and contact plugs 128 resides interconnect structure 130. Interconnect structure 130 includes dielectric layers 132, and metal lines 134 and vias 136 formed in dielectric layers 132. Dielectric layers 132 are alternatively referred to as Inter-Metal Dielectric (IMD) layers 132, hereinafter. In accordance with some embodiments of the present disclosure, at least the lower ones of dielectric layers 132 are formed of a low-k dielectric material having a dielectric constant (k-value) lower than about 3.0 or about 2.5. Dielectric layers 132 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 132 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 132 includes depositing a porogen-containing dielectric material, and then performing a curing process to drive out the porogen, and hence the remaining dielectric layers 132 becomes porous. Etch stop layers (not shown), which may be formed of silicon carbide, silicon nitride, or the like, may be formed between IMD layers 132, and are not shown for simplicity.

Metal lines 134 and vias 136 are formed in dielectric layers 132. The metal lines 134 at a same level may be collectively referred to as a metal layer hereinafter. In accordance with some embodiments of the present disclosure, interconnect structure 130 includes a plurality of metal layers that are interconnected through vias 136. Metal lines 134 and vias 136 may be formed of copper or copper alloys, and they can also be formed of other metals. The formation process may include single damascene and dual damascene processes. In a single damascene process, a trench is first formed in one of dielectric layers 132, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier and a copper-containing metallic material over the diffusion barrier. The diffusion barrier may include titanium, titanium nitride, tantalum, tantalum nitride, or the like.

Metal lines 134 include metal lines 134A, which may be referred to as top metal lines. Top metal lines 134A are also collectively referred to as being a top metal layer. The respective dielectric layer 132A may be formed of a non-low-k dielectric material such as Un-doped Silicate Glass (USG), silicon oxide, silicon nitride, or the like. Dielectric layer 132A may also be formed of a low-k dielectric material, which may be selected from the similar materials of the underlying IMD layers 132.

In accordance with some embodiments of the present disclosure, dielectric layers 138 and dielectric bonding layers 152 are formed over the top metal lines 134A. Dielectric layers 138 and dielectric bonding layer 152 may be formed of silicon oxide, silicon oxynitride, silicon oxy-carbide, or the like, and in some embodiments dielectric layer 138 may be formed of multiple dielectric sub-layers 138A, 138B, and 138C, for example. First, dielectric sub-layer 138A may be formed. Via openings corresponding to vias 146 may next be formed in the dielectric sub-layer 138A using a photo lithographic process using, for example, photo resists and/or hard masks which are formed and patterned over dielectric sub-layer 138A to aid the formation of via openings corresponding to the vias 146. An anisotropic etch may be used to form these trenches through the photo resists and/or hard masks.

Vias 146 and metal features 144 may be formed over the dielectric sub-layer 138A. Vias 146 and metal features 144 may be formed by processes similar to the formation of vias 136 and metal lines 134, described above, though other suitable process may be used. Metal features 144 and vias 146 may be formed of copper or copper alloys, and they can also be formed of other metals. In an embodiment, the metal features 144 and/or vias 146 may be formed of aluminum or an aluminum copper alloy. In some embodiments, the metal features 144 may be used for die testing.

In some embodiments, the metal features 144 may be directly probed for performing chip probe (CP) testing of the wafer 100. Optionally, solder regions (e.g., solder balls or solder bumps) may be disposed on the metal features 144 and the solder regions may be used to perform CP testing on the wafer 100. CP testing may be performed on the wafer 100 to ascertain whether the each die 105 of wafer 100 is a known good die (KGD). Thus, only dies 105 which are KGDs undergo subsequent processing for packaging, and dies which fail the CP testing are not packaged. After testing, the solder regions (if any) may be removed in subsequent processing steps.

The dielectric sub-layer 138B may then be deposited over the metal features 144 up to a desired thickness. In some embodiments, the dielectric sub-layer 138B may then be planarized to level the top surface, while in other embodiments, the leveling step may be omitted. In some embodiments, the dielectric sub-layer 138C is then deposited. Other embodiments may not use the dielectric sub-layer 138C and it may be omitted.

Next, bond pad vias 156 and bond pad vias 157 may be formed. Bond pad vias 156 extend through the entire dielectric layer(s) 138 to the interconnect structure 130 and bond pad vias 157 extend to the metal features 144 and electrically couple thereto. Openings for the bond pad vias 156 and bond pad vias 157 may be formed using photo resists (not shown) and/or hard masks (not shown) which are formed and patterned over dielectric layer 138 to aid the formation of the openings for the bond pad vias 156 and bond pad vias 157. In accordance with some embodiments of the present disclosure, an anisotropic etch is performed to form the openings. The etch may stop on either the metal feature 144 for bond pad vias 157 or on the metal lines 134 of interconnect structure 130 for bond pad vias 156.

The openings for the bond pad vias 156 and the bond pad vias 157 may next be filled with conductive materials. A conductive diffusion barrier (not shown) may be formed first. In accordance with some embodiments of the present disclosure, the conductive diffusion barrier may be formed of titanium, titanium nitride, tantalum, tantalum nitride, or the like. The conductive diffusion barrier may be formed, for example, using Atomic Layer Deposition (ALD), Physical Vapor Deposition (PVD), or the like. The conductive diffusion barrier may include a layer in the openings for the bond pad vias 156 and the bond pad vias 157 and a layer extending over the upper surface of the dielectric layer 138.

Next, a metallic material is deposited to form the bond pad vias 156 and the bond pad vias 157, for example, through Electro-Chemical Plating (ECP) or another suitable deposition process. The metallic material is deposited on the conductive diffusion barrier and fills the remaining openings for the bond pad vias 156 and the bond pad vias 157. The metallic material may also extend over the top surface of the dielectric layer 138. The metallic material may include copper or copper alloy. The bond pad vias 156 and bond pad vias 157 may be formed simultaneously.

A planarization process such as a Chemical Mechanical Polish (CMP) process may then be performed to remove excess portions of the metallic material and the diffusion barrier, until dielectric layer 138 is exposed. The remaining portions of the diffusion barrier and metallic material include bond pad vias 156 and bond pad vias 157.

Next, a dielectric bonding layer 152 may be formed over the dielectric layer 138 and openings formed therein for bond pads 154*bp*. The bond pads 154*bp* may include dummy bond pads 154*d*, which may be uncoupled pads electrically from any of the other conductive elements in the device, or active bond pads 154*b*, which may be coupled to underlying conductive features such as bond pad vias 156 and bond pad vias 157. The openings may be formed using photo resists (not shown) and/or hard masks (not shown) which are formed and patterned over dielectric bonding layer 152 to aid the formation of the openings for the bond pads 154*bp*. In accordance with some embodiments of the present disclosure, an anisotropic etch or wet etch is performed to form the openings for the bond pads 154*bp*. The etch may stop on dielectric sub-layer 138C, which may function as an etch stop, in some embodiments. In other embodiments the dielectric bonding layer 152 may have etch selectivity with the dielectric layer 138, so that the dielectric layer 138 is not etched through after the dielectric bonding layer 152 is etched through. In some embodiments, the etch may be time based. The openings for the bond pads 154*bp* may expose upper surfaces of the bond pad vias 156 and bond pad vias 157.

Next, a diffusion barrier and metallic material may be deposited in the openings to form the bond pads 154*bp*. Forming the bond pads 154*bp* may use processes and materials similar to those used to form the bond pad vias 156 and bond pad vias 157, described above. A planarization process such as a Chemical Mechanical Polish (CMP) process may then be performed to remove excess portions of the metallic material and the diffusion barrier, until the dielectric bonding layer 152 is exposed. The remaining portions of the diffusion barrier and metallic material include bond pads 154*bp* which are subsequently used for bonding to another device. It is appreciated that metal lines may also be formed simultaneously as bond pads 154*bp*.

In some embodiments, the bond pad vias 156 and 157 may be formed at the same time as the bond pads 154*bp*. In such embodiments, after the dielectric bonding layer 152 is formed, openings are made in the dielectric bonding layer 152, as described above. Then, further openings are made in the dielectric layer 138 for the bond pad vias 156 and bond pad vias 157, as described above. Then, the conductive diffusion barrier and metallic material may be formed, as described above, for both the bond pad vias 156 and 157 and the bond pads 154*bp* in the same process. Afterwards, a planarization process such as a CMP process may be used to remove excess portions of the metallic material and the diffusion barrier, until the dielectric bonding layer 152 is exposed. The remaining portions of the diffusion barrier and metallic material include bond pads 154*bp* which are subsequently used for bonding to another device. Metal lines running in the same layer as the bond pads 154*bp* may also be formed simultaneously as bond pads 154*bp*. It is appreciated that additional bond pad vias 156 and 157 may be formed that those illustrated.

The location and number of bond pads 154*bp* may be adjusted based on the devices which are to be bonded to them in subsequent processes. In some embodiments, one or more of the bond pads 154*bp* may not be electrically connected to any devices in the die 105. Such bond pads 154*bp* may be considered dummy bond pads 154*d*. In some embodiments, dummy bond pads 154*d* may continue across the surface of the die 105, while in other embodiments, bond pads 154*bp* including dummy bond pads 154*d* may be located only where other devices are to be attached.

Figure 4:
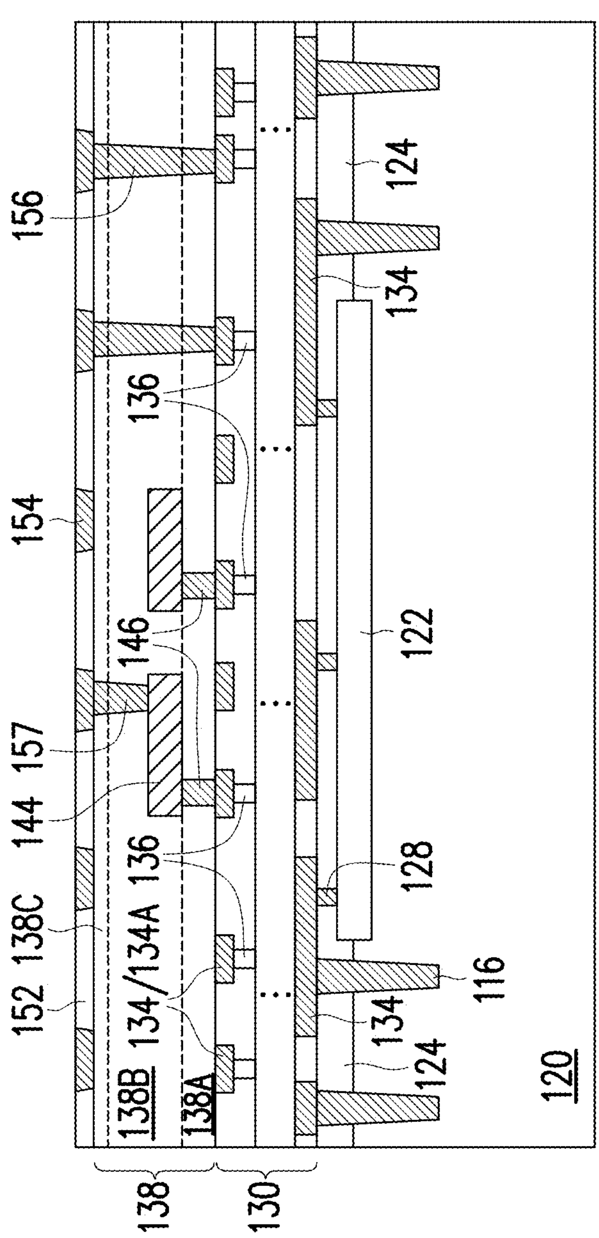

FIG. 4 illustrates the die 105 after being singulated from the wafer 100. The singulation process 160 (see FIG. 3) used to singulate the device die from the wafer 100 may be any suitable process, such as using a die saw, a laser cutting, or the like to cut through the wafer 100 and structures formed thereupon.

Figure 5:
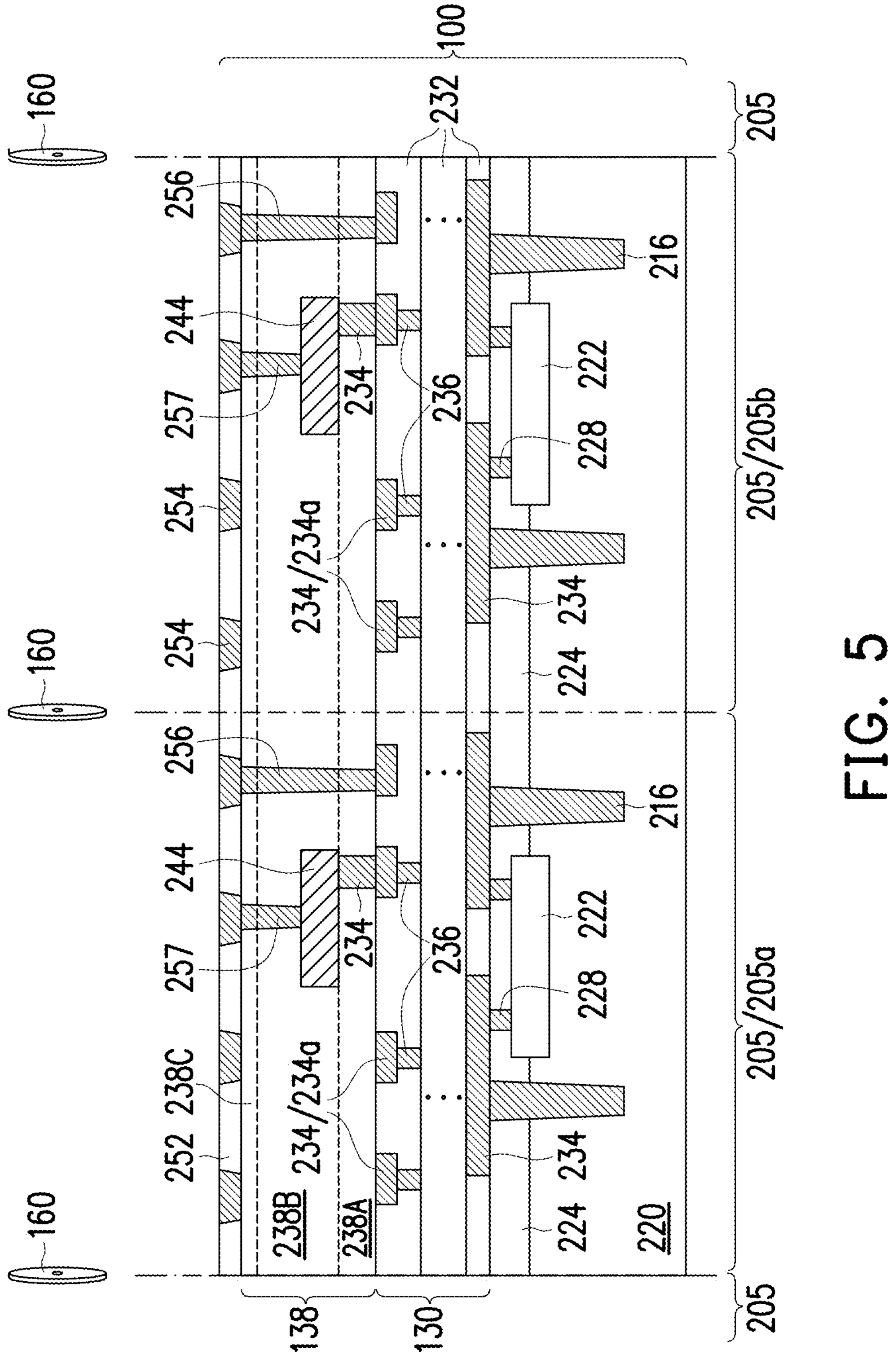
FIGS. 5 through 6 illustrate cross-sectional views of intermediate stages in the formation of a package component in accordance with some embodiments of the present disclosure.

FIG. 5 illustrates the formation of wafer 200, which includes dies 205 (e.g., device die 205*a* and device die 205*b*) therein. In accordance with some embodiments of the present disclosure, dies 205 are logic dies, which may be CPU dies, MCU dies, IO dies, Base-Band dies, or AP dies. Dies 205 may also be memory dies. Wafer 200 includes semiconductor substrate 220, which may be a silicon substrate.

Dies 205 may include integrated circuit devices 222, ILD 224 over the integrated circuit devices 222, and contact plugs 228 to electrically connect to the integrated circuit devices 222. Dies 205 may also include interconnect structures 230 for connecting to the active devices and passive devices in dies 205. Interconnect structures 230 include metal lines 234 and vias 236.

Through-Silicon Vias (TSVs) 216, sometimes referred to as through-semiconductor vias or through-vias, may optionally be formed to penetrate into the semiconductor substrate 220 (and eventually through the semiconductor substrate 220 by revealing from the opposite side). If utilized, the TSVs 216 may be used to connect the devices and metal lines formed on the front side (the illustrated top side) of semiconductor substrate 220 to the backside. TSVs 216 may be formed using processes and materials similar to those used to form the bond pad vias 156, discussed above, and are not repeated, including for example a time-based etching process so that the TSVs 216 may have a bottom which is disposed between the top surface and the bottom surface of the semiconductor substrate 220.

Dies 205 may include dielectric layers 238 and dielectric bonding layer 252. Vias 246 and metal features 244 may be formed and disposed in the dielectric layers 238 (which may include multiple dielectric layers 238A, 238B, and 238C). Bond pad vias 256 and bond pad vias 257 are also formed and disposed in dielectric layers 238, and bond pads 254 are formed and disposed in the dielectric bonding layer 252.

The processes and materials used to form the various features of dies 205 may be similar to the process and materials used to form their like features in dies 105, and hence the details are not repeated herein. Like features between dies 105 and dies 205 share the same last two numbers in their reference labels.

Figure 6:
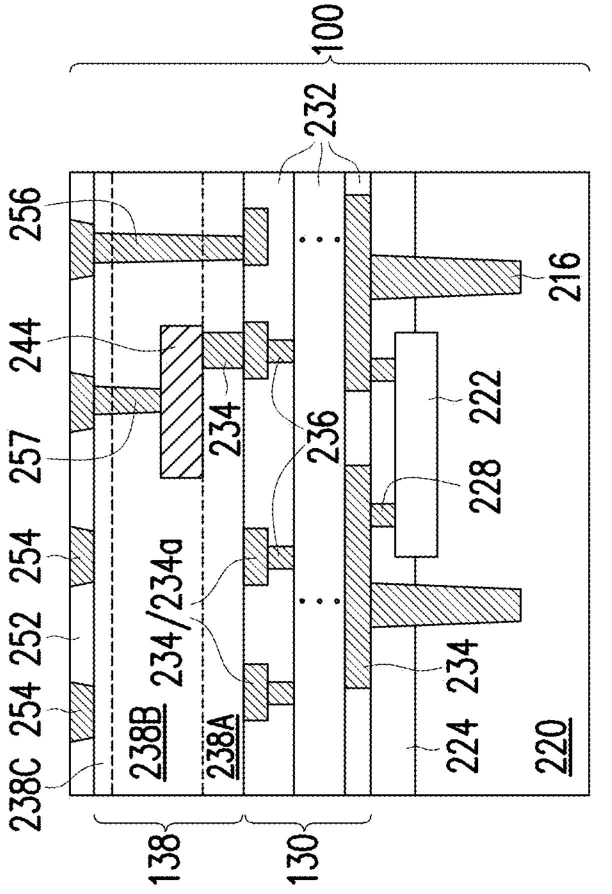

In FIG. 6, wafer 200 is singulated into a plurality of discrete device dies 205, including for example, device die 205*a* and device die 205*b*. The singulation process 160 (see FIG. 5) may be the same or similar to the singulation process discussed above with respect to FIG. 4.

Figure 7:
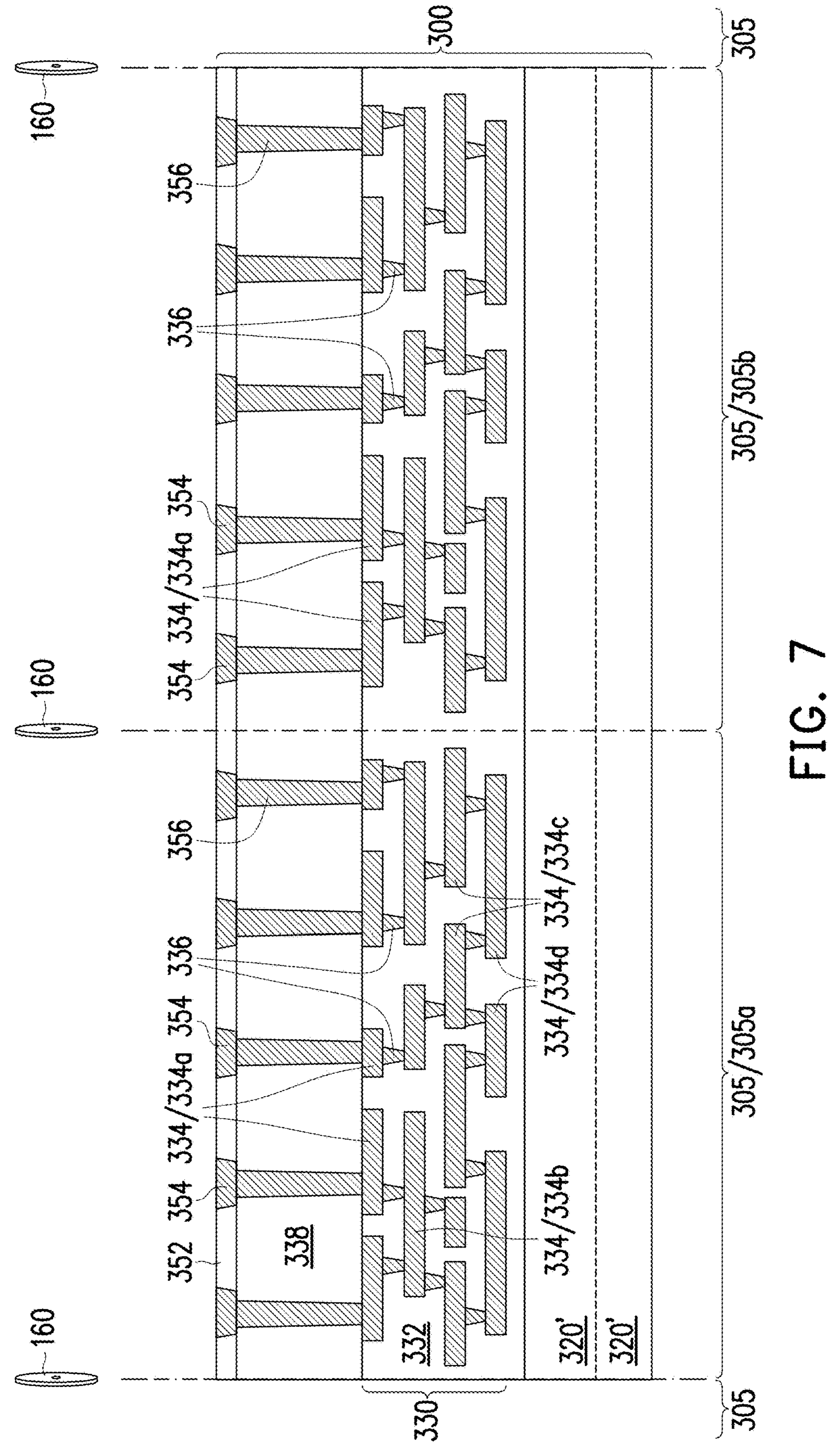
FIGS. 7 through 8 illustrate cross-sectional views of intermediate stages in the formation of a bridge component in accordance with some embodiments of the present disclosure.

FIG. 7 illustrates the formation of wafer 300, which includes bridge dies 305 (e.g., silicon bridge dies 305*a* and 305*b*) therein, in accordance with some embodiments. The substrate 320 may include any of the candidate substrates discussed above with respect to the semiconductor substrate 120. An interconnect structure 330 is provided to electrically connect the various bond pads 354 to others of the various bond pads 354 and/or to the optional TSVs.

The interconnect structure 330 includes dielectric layers 332, and metal lines 334 and vias 336 formed in dielectric layers 332. Forming the interconnect structure 330 may use the same processes and materials as those described above with respect to the interconnect structure 130 (and dielectric layers 132 for the dielectric layers 332, metal lines 134 for the metal lines 334, and vias 136 for the vias 336).

Bridge dies 305 may include dielectric layers 338 and a dielectric bonding layer 352. Bond pad vias 356 are formed and disposed in dielectric layers 338, and bond pads 354 are formed and disposed in the dielectric bonding layer 352. The processes and materials used to form the various features of the bridge dies 305 may be similar to the processes and materials used to form their like features in die 105, and hence the details are not repeated herein. Like features between die 105 and bridge die 305 share the same last two numbers in their labels.

After forming the bond pads 354, the substrate 320 of the bridge dies may be thinned to become the substrate 320' so that an overall thickness of the wafer 300 is between about 15 μm and 30 μm. In some embodiments, the substrate 320 may be entirely removed through the thinning process. The thinning process may include an etching process, a grinding process, a CMP process, or combinations thereof.

Figure 8:
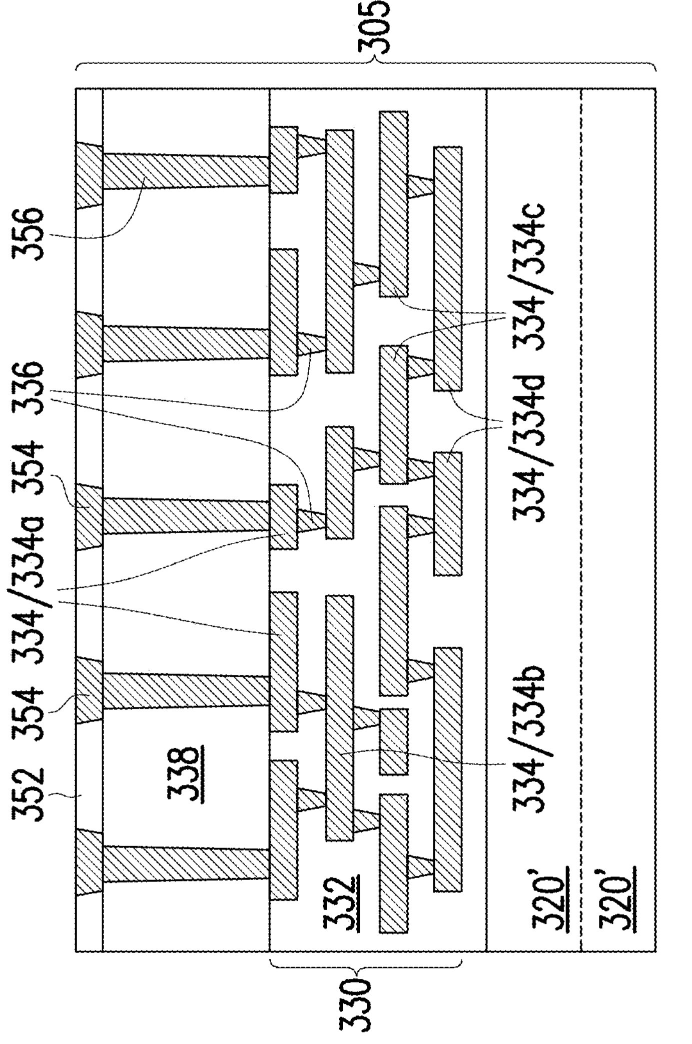

In FIG. 8, wafer 300 is singulated into a plurality of discrete bridge dies 305, including for example, bridge die 305*a* and bridge die 305*b*. The singulation process 160 (see FIG. 7) may be the same or similar to the singulation process discussed above with respect to FIG. 4.

Figures 9A, 9B:
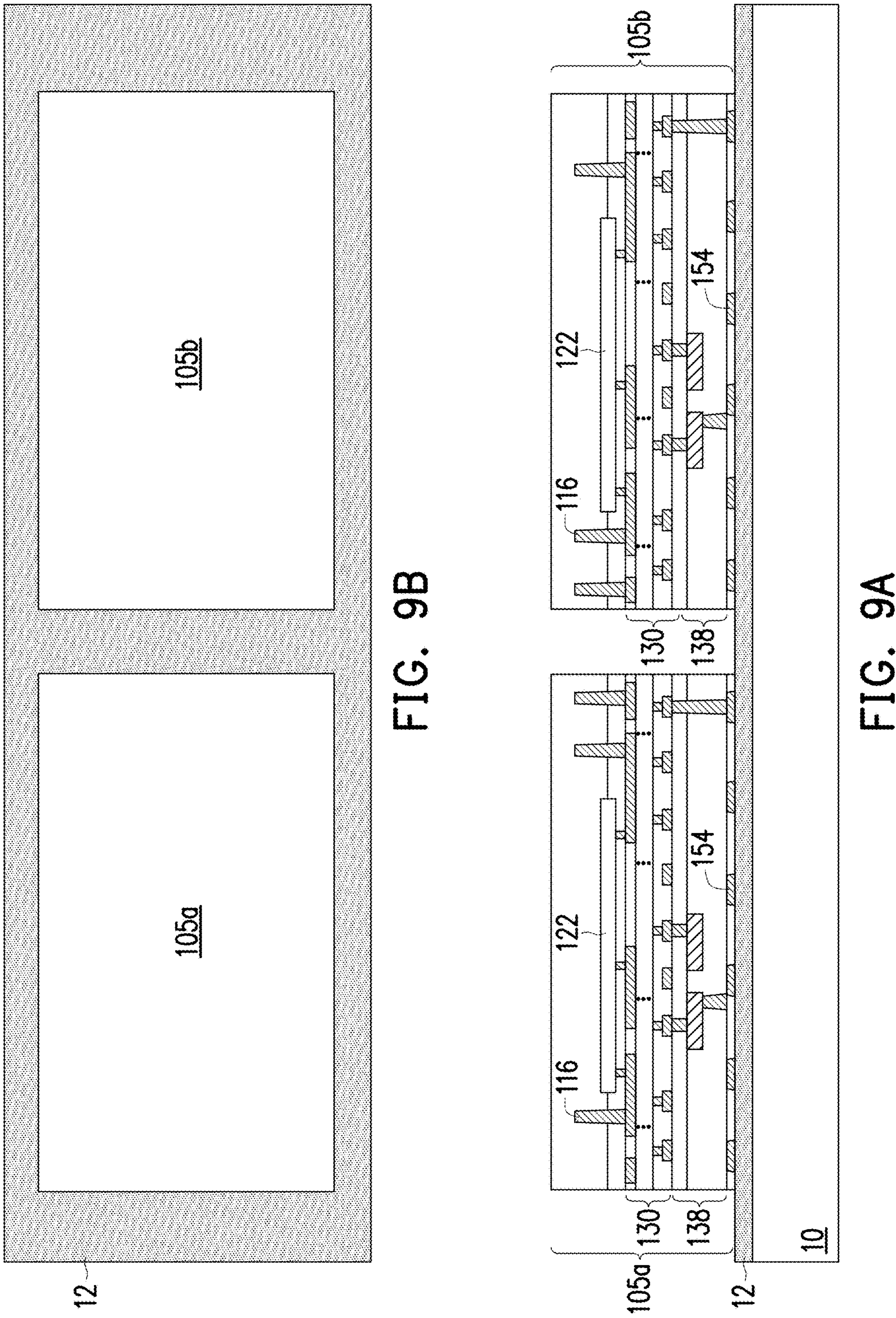
FIGS. 9A, 9B, 10A, 10B, 11A, 11B, 12A, 12B, 12C, 12D, 12E, 12F, 12G, 13A, 13B, 13C, 13D, 13E, 13F, 13G, 14A, 14B, 15, 16, 17, 18, and 19 illustrate intermediate stages for forming a package structure having a bridge die utilized therein and various configurations of die landing structures, in accordance with some embodiments.

FIGS. 9A and 9B through FIG. 19 illustrate intermediate steps in the formation of a SOIC package utilizing a bridge die (such as the bridge die 305). Some of the Figures include one or more top down views. For example, FIG. 9A is a cross-sectional view and FIG. 9B is a top down view. It should be understood that these views are merely examples and variations are within the scope of this description. For example, the top view and cross-sectional view provided for each of the Figures may only be partial views and other devices or structures may be incorporated.

In FIGS. 9A and 9B, a carrier substrate 10 is provided and a release layer 12 is formed on the carrier substrate 10. The carrier substrate 10 may be a glass carrier substrate, a ceramic carrier substrate, or the like. The carrier substrate 10 may be a wafer, such that multiple packages can be formed on the carrier substrate 10 simultaneously.

The release layer 12 may be formed of a polymer-based material, which may be removed along with the carrier substrate 10 from the overlying structures that will be formed in subsequent steps. In some embodiments, the release layer 12 is an epoxy-based thermal-release material, which loses its adhesive property when heated, such as a light-to-heat-conversion (LTHC) release coating. In other embodiments, the release layer 12 may be an ultra-violet (UV) glue, which loses its adhesive property when exposed to UV lights. The release layer 12 may be dispensed as a liquid and cured, may be a laminate film laminated onto the carrier substrate 10, or may be the like. The top surface of the release layer 12 may be leveled and may have a high degree of planarity.

Two or more of the dies 105 may be placed on the carrier substrate 10 and attached to the release layer 12. Each of the dies 105, such as die 105*a* and 105*b* (which together may be referred to as dies 105), may be placed on the carrier substrate 10 by a pick and place process to place the dies 105 on the release layer 12. In some embodiments, such as illustrated in FIGS. 9A and 9B, the dies 105*a* and 105*b* are placed face down (back side up). In other embodiments, the dies 105*a* and 105*b* may be placed face up. It should be understood that each of the dies 105 may have the same or different functionalities, and may be the same size as each other or different sizes from each other.

Figure 10B:
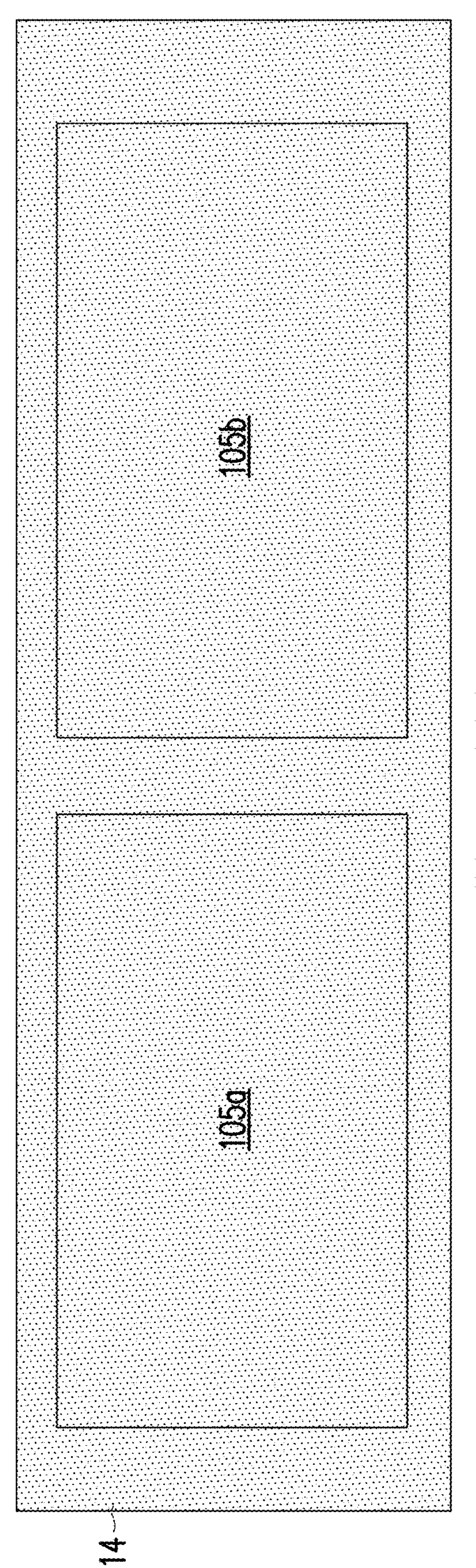
Figure 10A:
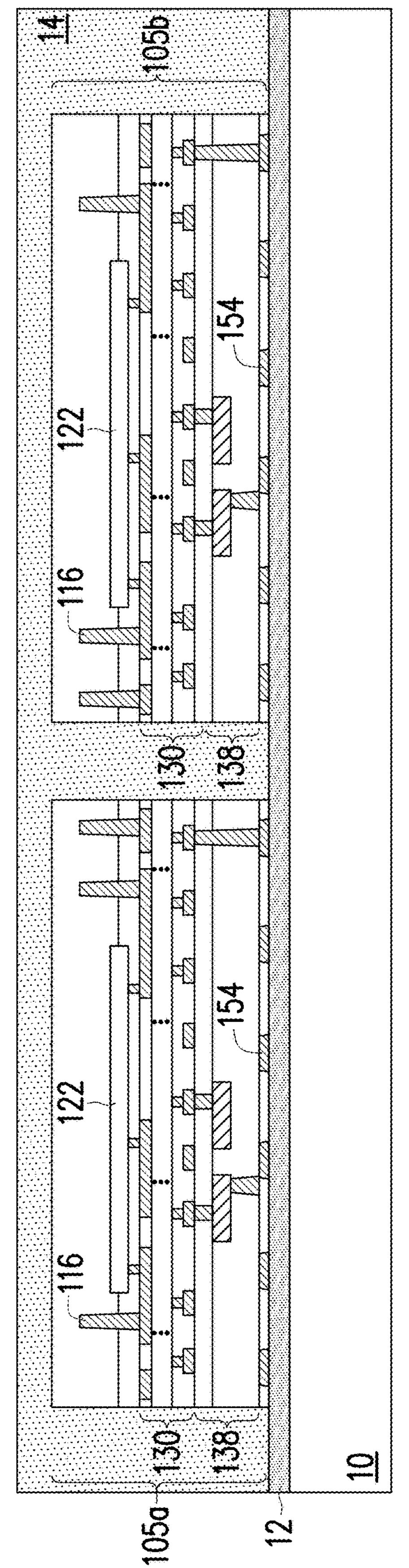

In FIGS. 10A and 10B, a fill material, such as an insulating material or encapsulant 14 may be deposited over and laterally surrounding the dies 105*a* and 105*b*. The encapsulant 14 may include a dielectric material such as a resin, epoxy, polymer, oxide, nitride, the like, or combinations thereof, which may be deposited by any suitable process, such as by flowable CVD, spin-on, PVD, the like, or combinations thereof.

Figure 11B:
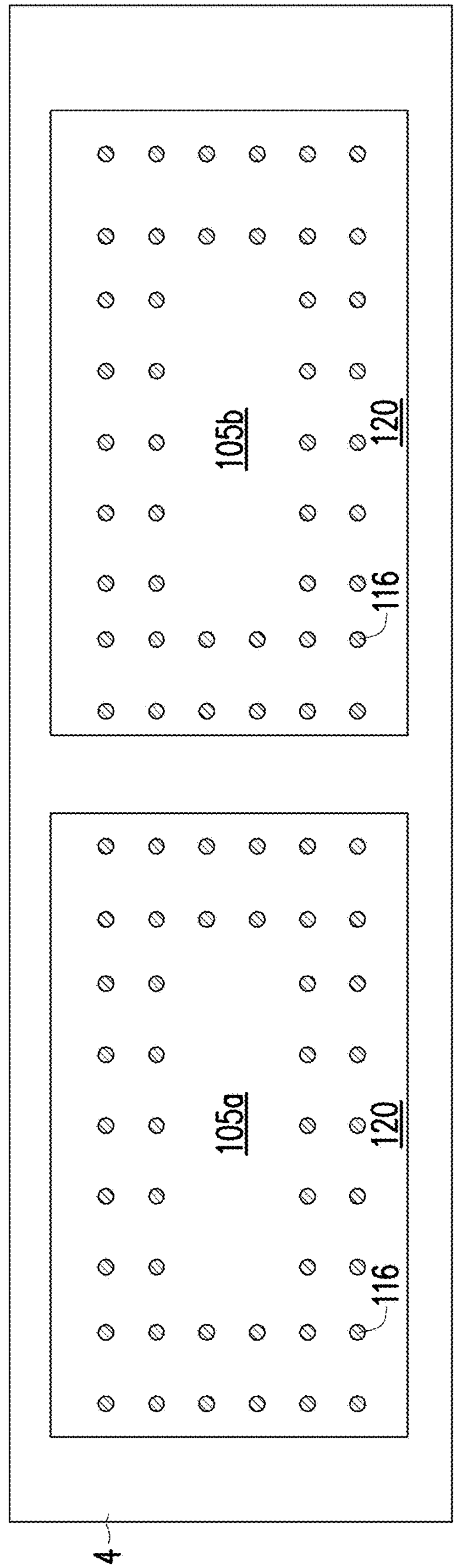
Figure 11A:
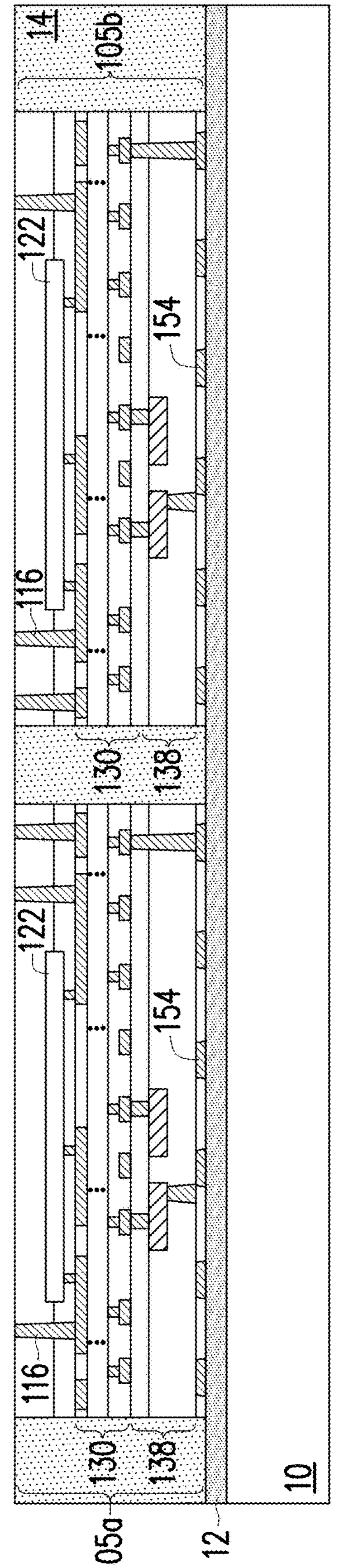

In FIGS. 11A and 11B, a planarization process may be used to level the upper surface of the encapsulant 14 with the upper surfaces of the dies 105*a* and 105*b*. The planarization process may include a grinding and/or a chemical mechanical polishing (CMP) processes. The planarization process may be continued until the TSVs 116 are exposed through the semiconductor substrate 120 (see FIG. 4) of each of the dies 105.

Figures 12A, 12B:
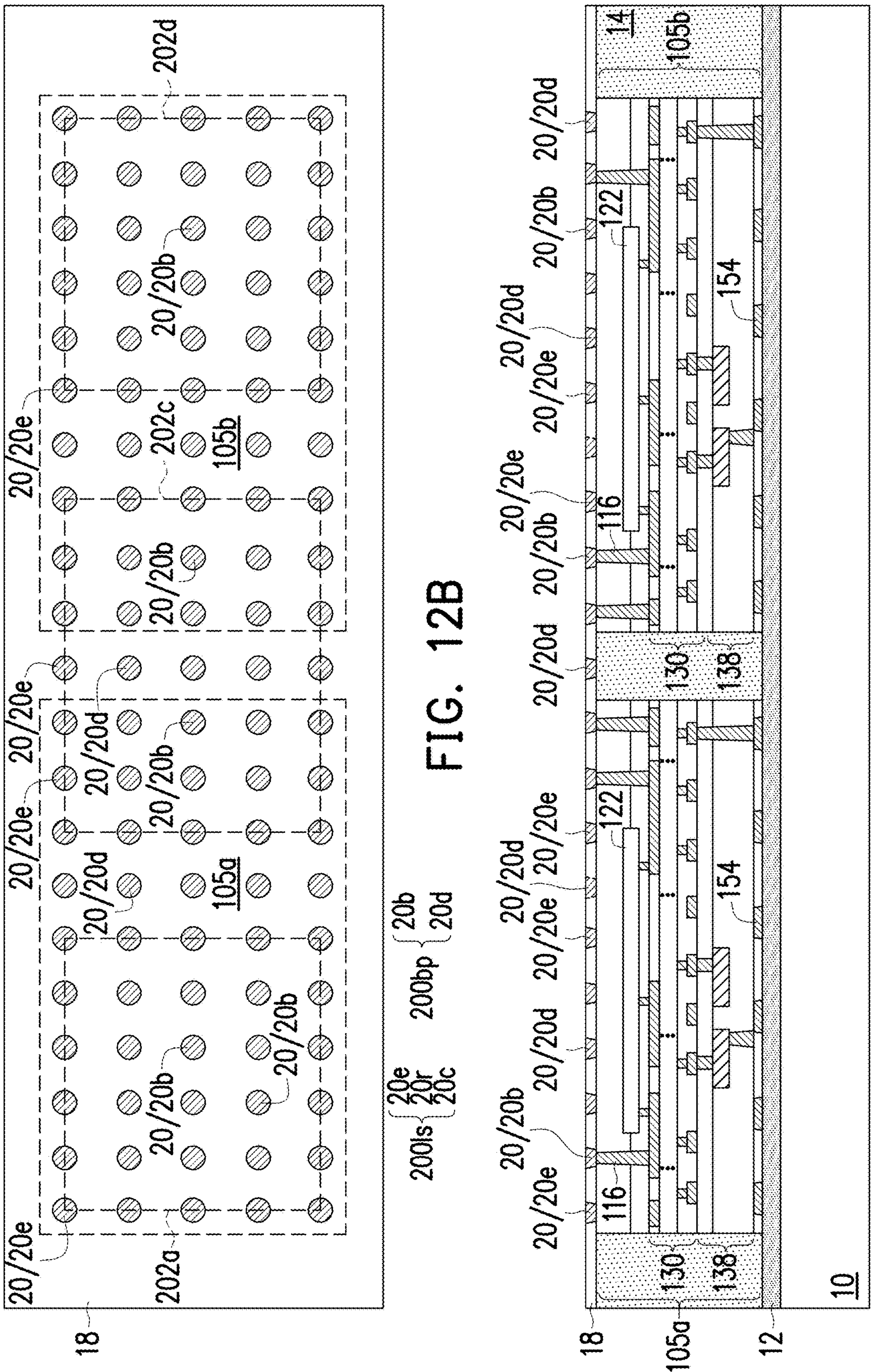

FIGS. 12A, 12B, 12C, 12D, 12E, 12F, 12G illustrate the formation of a bonding layer 18 and the formation of bond structures 20 in the bonding layer 18. FIG. 12A is a cross-sectional view and FIGS. 12B, 12C, 12D, 12E, 12F, and 12G illustrate top down views of the structure of FIG. 12A according to various embodiments, the various embodiments demonstrating different configurations of the bond structures 20. The bonding layer 18 may be formed over the upper surface of the encapsulant 14 TIVs 116. Bond structures 20 are formed in the bonding layer 18. The bond structures 20 may include active bond pads 20*b* which are physically coupled to a TSV 116, dummy bond pads 20*d* which are not connected to any metal features of the dies 105, edge landing structures 20*e* which are a particular type of dummy bond pad which is disposed at a periphery of a die attach area, ring landing structures 20*r* which are ring-like metal lines disposed around and overlapping a periphery of the die attach area, and corner landing structures 20*c* which are el-shaped metal lines disposed at corners of the die attach area. The various bond structures 20 are discussed in greater detail below. For simplicity, the dummy bond pads 20*d* and active bond pads 20*b* may simply be referred to as bond pads 20*bp*.

The bonding layer 18 may be formed of any suitable insulating layer, such as silicon oxide, silicon nitride, silicon carbide, silicon oxycarbide, silicon oxynitride, the like, or combinations thereof, and may be deposited using any suitable technique, such as CVD, PVD, spin on, etc. To form the bond structures 20, openings may be formed in the bonding layer 18 according to the positions and shapes of the bond structures 20. The openings may be formed using photo resists (not shown) and/or hard masks (not shown) which are formed and patterned over the bonding layer 18 to aid the formation of the openings for the bond structures 20. In some embodiments, an anisotropic etch or wet etch is performed to form the openings for the bond structures 20. The etch may stop on the encapsulant 14 and substrate 120 of the dies 105*a* and 105*b*. The openings for the bond structures 20 may expose upper surfaces of the TSVs 116.

Next, a diffusion barrier and metallic material may be deposited in the openings to form the bond structures 20. The diffusion barrier and metallic material may be deposited using materials and techniques such as those discussed above for the formation of the bond pad vias 156 and 157. A planarization process such as a Chemical Mechanical Polish (CMP) process may then be performed to remove excess portions of the metallic material and the diffusion barrier, until the bonding layer 18 is exposed. The remaining portions of the diffusion barrier and metallic material include bond structures 20 which are subsequently used for bonding to another device.

As illustrated in FIG. 12A, in some embodiments, one or more dummy bond pads 20*d* may be disposed over a portion of the encapsulant 14 which is between the dies 105*a* and 105*b*. The dummy bond pads 20*d* may be included for pattern loading considerations and may also help provide a better direct bonding, which results in less likelihood of failure.

Referring to FIGS. 12B, 12C, 12D, 12E, 12F, and 12G, a die attach area 202*a* (shown in dashed lines) is at an upper surface of the die 105*a* (shown in dashed lines). Similarly, a die attach area 202*b* (shown in dashed lines) is at an upper surface of the die 105*b* (shown in dashed lines). Further, a die attach area 202*c* is at an upper surface of both the die 105*a* and the die 105*b* and overlaps the encapsulant 14 between the dies 105*a* and 105*b*. The bond structures 20 entirely within the die attach areas 202*a*, 202*b*, and 202*c* may be bond pads 20*bp*, including active bond pads 20*b* and/or dummy bond pads 20*d*. The bond structures 20 disposed at the edge of the die attach areas 202*a*, 202*b*, and 202*c* are dummy structures and may be edge landing structures 20*e*, ring landing structures 20*r*, or corner landing structures 20*c*. These may collectively be referred to as landing structures 20*ls*. Each of these landing structures 20*ls* are disposed at an edge and/or corner of the die attach areas 202*a*, 202*b*, and 202*c* and are partially within the die attach areas and partially outside the die attach areas.

In a subsequent process, device dies and/or bridge dies are attached to the die attach areas 202*a*, 202*b*, 202*c* and bonded to the bond pads 20*bp*. An edge of the device dies and/or bridge dies land on the landing structures 20*ls* (including the edge landing structures 20*e*, ring landing structures 20*r*, and/or corner landing structures 20*c*) and a dielectric material at an edge of the device dies and/or bridge dies is adjoined to the landing structures 20*ls*, in accordance with some embodiments, as explained below.

In FIG. 12B, the edge landing structures 20*e* continue completely around the periphery of the die attach areas 202*a*, 202*b*, and 202*c*. The edge landing structures 20*e* continue at a same size and pitch as the bond pads 20*bp*. An edge landing structure 20*e* is disposed at each of the four corners of each of the die attach areas 202*a*, 202*b*, and 202*c*. In some embodiments, the bond structures 20 are dispersed in a regular pattern, each bond structure 20 having a same size at a same pitch. In such embodiments, a regular pattern can help with pattern loading effects. In FIG. 12B, for example, dummy bond pads 20*d* (outlined in a dashed line) are disposed between the die attach area 202*a* and die attach area 202*c* to continue the pattern of the bond structures 20.

Figures 12C, 12D:
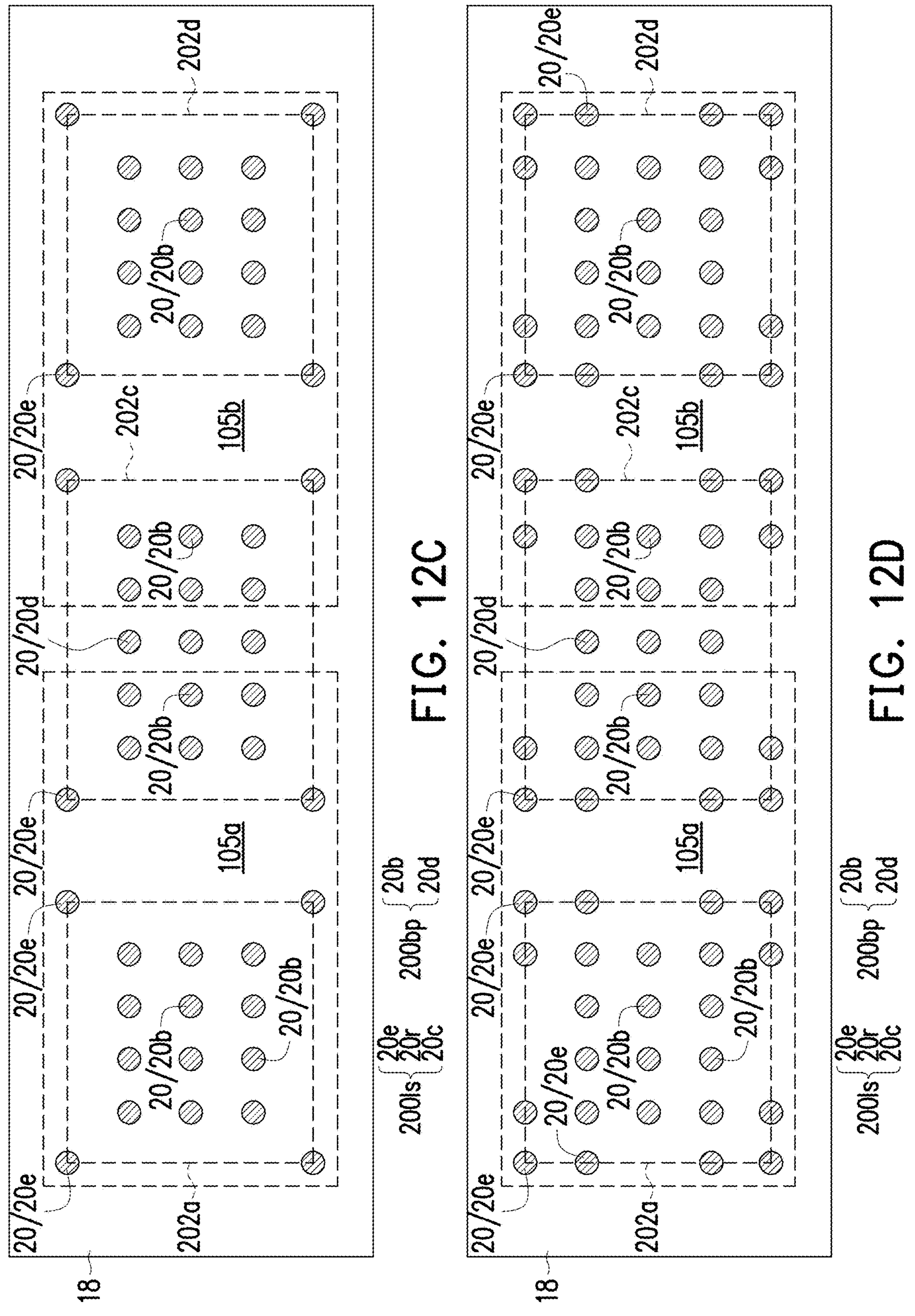

In FIG. 12C, the edge landing structures 20*e* are disposed only at the corners of the die attach areas 202*a*, 202*b*, and 202*c*.

In FIG. 12D, the edge landing structures 20*e* are disposed at the corners of the die attach areas 202*a*, 202*b*, and 202*c*. In addition, one of the edge landing structures 20*e* is located on the periphery of the die attach areas 202*a*, 202*b*, and 2020 in each direction from the corner edge landing structures 20*e* and adjacent the corner edge landing structures 20*e*. Where the pitch between bond structures 20 in the die attach areas 202*a*, 202*b*, and/or 202*c* is a regular pitch, the additional edge landing structures 20*e* may each be spaced one pitch away from the corner edge landing structures 20*e* in each of the two directions toward others of the corner edge landing structures 20*e*.

Figures 12E, 12F:
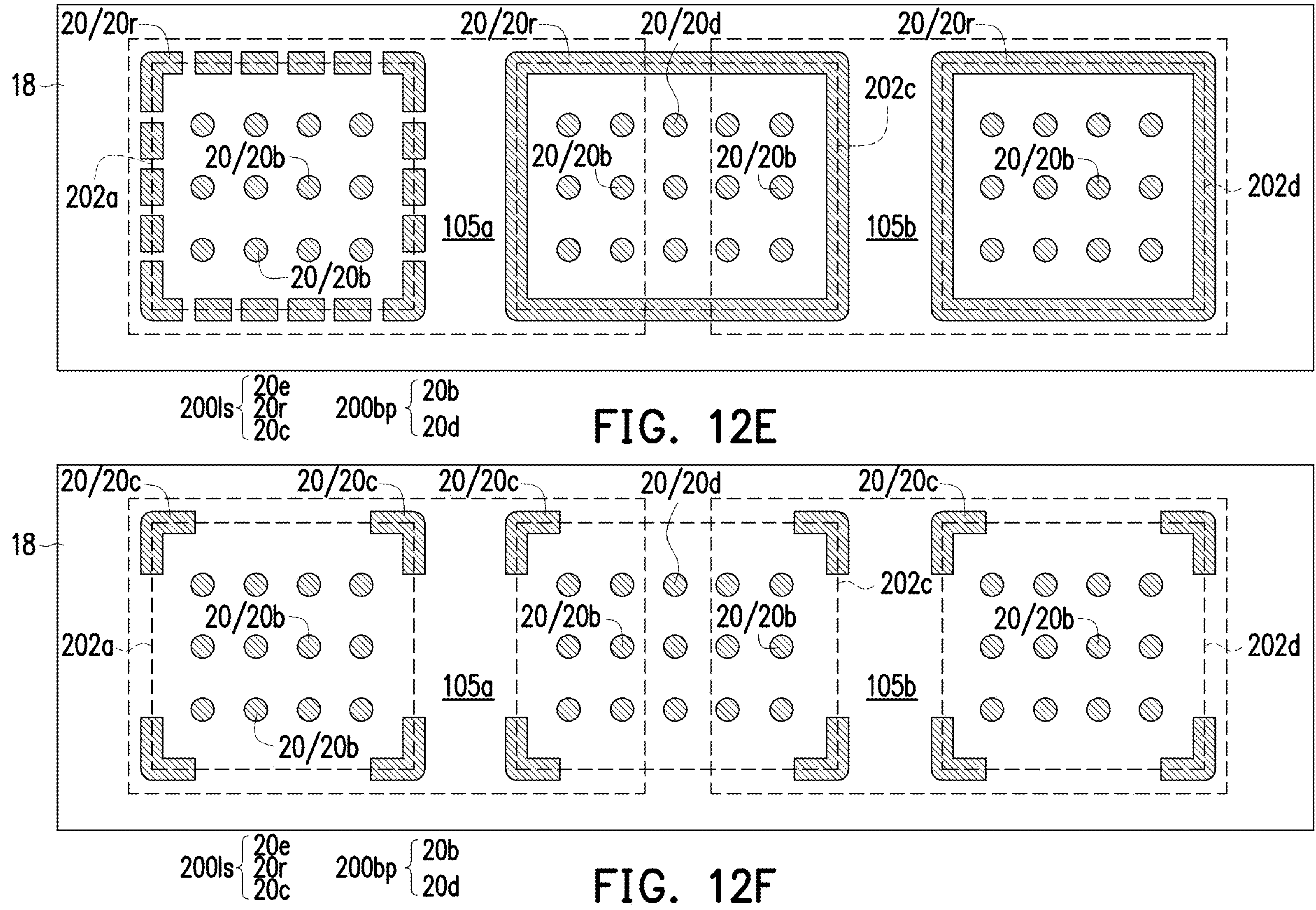

In FIG. 12E, instead of using edge landing structures 20*e*, the landing structures 20*ls* are a ring landing structure 20*r*. The ring landing structure 20*r* traverses the periphery of the die attach areas 202*a*, 202*b*, and 202*c*. In some embodiments, the ring landing structure 20*r* may be a broken ring or segmented ring, such as illustrated with respect to the corresponding die attach area 202*a*, which looks like disjointed line segments in a top down view.

In FIG. 12F, the landing structure is a corner landing structure 20*c*. The corner landing structure 20*c* is a particular type of ring landing structure 20*r* with a portion of the ring removed between corner portions. For example, in one corner of the die attach area 202*a*, a first leg of an L-shaped corner landing structure 20*c* extends along a first edge of the die attach area 202*a*, and a second leg of the L-shaped corner landing structure 20*c* extends along a second edge of the die attach area 202*a*, the first edge intersecting the second edge.

Figure 12G:
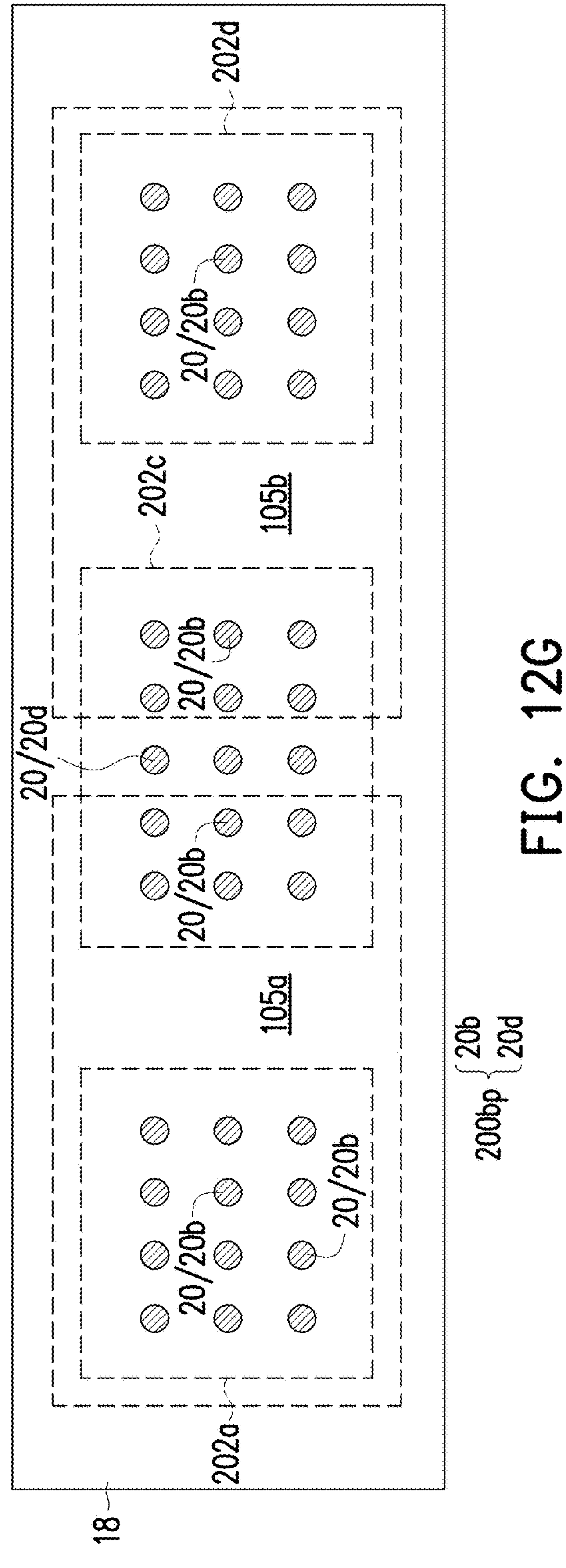

FIG. 12G illustrates an embodiment which does not utilize the landing structures of the bond structures 20. In such embodiments, each of the bond structures 20 are bond pads 20*b* or dummy bond pads 20*d*.

It should be understood that each of the arrangements of bond structures 20 discussed with respect to FIGS. 12B through 12G may be combined without limitation. For example, the die attach areas 202*a* and 202*b* may utilize edge landing structures 20*e* and the die attach area 202*c* may utilize ring landing structures 20*r*. In another example, the die attach area 202*c* may utilize a corner landing structure 20*c* and the die attach area 202*a* and die attach area 202*b* may omit landing structures. In short any of the landing structures 20*ls* may or may not be used without limitation with any of the die attach areas 202.

Figure 13A:
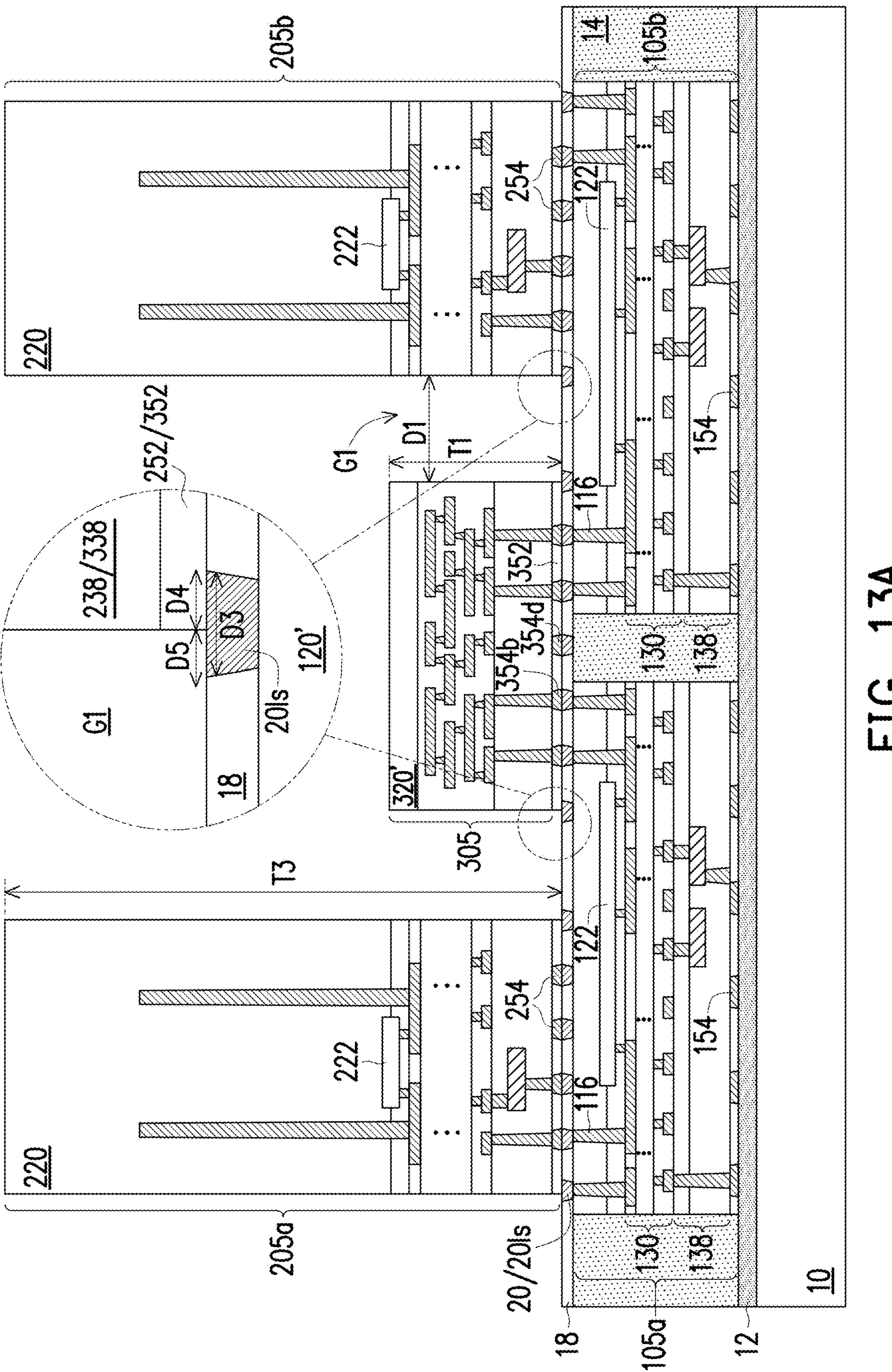

In FIGS. 13A, 13B, 13C, 13D, 13E, 13F, and 13G, the dies 205*a* and 205*b*, (which may be referred to as dies 205) and bridge die 305 are bonded to the dies 105. FIG. 13A is a cross-sectional view and FIGS. 13B, 13C, 13D, 13E, 13F, and 13G illustrate top down views of the structure of FIG. 13A according to the embodiments respectively discussed above for FIGS. 12B, 12C, 12D, 12E, 12F, and 12G.

Each of the pieces (i.e., dies 205 and bridge die 305) may be positioned over the bond structures 20 using a pick and place process. In some embodiments, each die 205 and each bridge die 305 may be placed and bonded one at a time, while in other embodiments, all of the dies 205 and bridge die 305 may be placed and then all bonded together at the same time. In some embodiments, such as when the bridge die 305 has a smaller thickness than the dies 205, the bridge die 305 may be placed first and bonded, then the remaining dies 205 may be placed and bonded.

The bonding mechanism for bonding the bridge die 305 to the dies 105*a* and 105*b* may utilize a direct bonding process, where the metal of the bond pads 20*bp* are directly bonded to the metal of the bond pads 354 and to the metal of the bond pads 254, without the use of solder material at an interface of the bond pads 354 and the bond pads 254. And further, the bonding mechanism for bonding the bridge die 305 to the device dies 105*a* and 105*b* may also include fusing dielectric bonding layers 252 to the bonding layer 18. And still further, as discussed in greater detail below, the bonding mechanism for bonding the bridge die 305 to the device dies 105*a* and 105*b* may also include bonding edge and/or corner portions of the dielectric bonding layers 252 to the landing structures 201*s*.

Each of the dies 205 bonded to the dies 105 may have been tested and determined to be a KGD prior to bonding to the dies 105. While one die 205 is illustrated as being bonded to each of the dies 105*a* and 105*b*, it should be appreciated that other dies like unto the die 205 may be bonded to the dies 105. The other device dies may be identical to the die 205 or may be different from the die 205. For example, the dies 205 and other dies may be different types of dies selected from the above-listed types. Also, dies 205 may be a digital circuit die, while the other dies may be an analog circuit die. Dies 105 and 205 (and other device dies, if any) in combination function as a system. Splitting the functions and circuits of a system into different dies such as dies 105 and 205 may optimize the formation of these dies, and may result in the reduction of manufacturing cost. Likewise, each of the bridge dies 305 bonded to the dies 105 to bridge connections between the dies 105 may be tested prior to bonding to the dies 105 and determined to be a KGD.

The bonding of dies 205 and bridge die 305 to dies 105*a* and 105*b* may be achieved through direct metal-to-metal bonding of electrical contacts, fusion of dielectric materials, and bonding between metal and dielectric materials. For example, bond pads 254 and 354 are bonded to bond structures 20 through metal-to-metal direct bonding. In accordance with some embodiments of the present disclosure, the metal-to-metal direct bonding is copper-to-copper direct bonding. Bond pads 254 and 354 may have sizes greater than, equal to, or smaller than, the sizes of the respective bond pads 20*bp*. Furthermore, dielectric bonding layers 252 and 352 are bonded to bonding layer 18 through dielectric-to-dielectric bonding, which may be fusion bonding, for example, with Si—O—Si bonds generated. Further still, edge regions and/or corner regions of the dielectric bonding layers 252 and 352 are bonded or fused to the landing structures 20*ls*.

To achieve the direct bonding, dies 205 and the bridge dies 305 are positioned in relation to the dies 105 to align their respective bond pads 254 and 354 to the bond pads 20*bp* over the dies 105. The upper dies (dies 205 and bridge die 305) are pressed together with the lower dies 105*a* and 105*b*. Then, an anneal is performed to cause the inter-diffusion of the metals in bond pads 20*bp* and the corresponding overlying bond pads 254 and 354. In some embodiments, the inter-diffusion of the metals in the bond structures 20 and the corresponding bond pads 254 and 354 cause the metal lattices of the corresponding bond pads to align, thereby causing the bond pads to adhere to one another. Even though they are adhered, an interface between the corresponding pads may still be observed, or in other words, the bond pads 254 and bond pads 20*bp* will remain discrete and not merge together completely, as if melted together.

In the same process, the anneal causes the dielectric bonding layer 252 and dielectric bonding layer 352 to be fusion bonded to the corresponding bonding layer 18. In particular, the dielectric materials in each of the layers may cross-bond to the opposite layer. For example, if the dielectric bonding layer 252 and bonding layer 18 are both silicon oxide ($SiO_2$), an oxygen atom from a molecule in one bonding layer can combine with a silicon atom and oxygen atom in another bonding layer to form cross-linked bonds, such as an Si—O—Si bond. A similar effect can happen with other dielectric materials, such as silicon nitride, silicon oxynitride, etc.

In the same annealing process, the anneal causes the portion of the dielectric bonding layer 252 and the portion of the dielectric bonding layer 352 which is in contact with the landing structures 20*ls* (e.g., the edge landing structures 20*e*, the ring landing structures 20*r*, and/or the corner landing structures 20*c*) to adjoin (or bond) with the metal of the landing structures 20*ls*. In some embodiments, the dielectric-to-metal bonding can happen by diffusion of the metal into the dielectric bonding layer 252. For example, the metal of the landing structures 20*ls* can diffuse into the dielectric bonding layer 252 or 352. Then, due to the anneal, a crystalline lattice can form which incorporates the metal and the material of the dielectric bonding layer 252 or 352. At the same time, the dielectric bonding layer 252 and dielectric bonding layer 352 can act as a diffusion barrier so that the diffusion does not continue into the dielectric bonding layer 252 or 352 to negatively impact the insulating properties of the dielectric bonding layer 252 or 352. In some embodiments, the dielectric-to-metal bonding can happen by the formation of chemical bonds between the metal of the landing structures 20*ls* and the dielectric bonding layer 252 or 352. For example, the anneal temperature can cause some of the bonds in the dielectric bonding layer 252 or 352 to break and reform by chemically combining with the metal of the landing structures 20*ls*. For example, a nitride or oxide of the metal material of the landing structures 20*ls* may form. For example, CuO or CuN may form at the interface between the dielectric bonding layer 252 or 352 and the landing structures 20*ls* when the landing structure 20*ls* is made of copper and the dielectric bonding layer is made of silicon oxide, silicon nitride, silicon oxynitride, or the like, and so forth. In some embodiments, both diffusion may occur and chemical bonds may form. The resulting bond between the landing structures 20*ls* and the dielectric bonding layer 252 or 352 are advantageously stronger for the edge and/or corners of the dies 205 and bridge die 305 than a typical fusion bonded edge and/or corners.

The annealing temperature may be higher than about 350° C., and may be in the range between about 350° and about 550° C. in accordance with some embodiments. The annealing time may be in the range between about 1.5 hours and about 3.0 hours, and may be in the range between about 1.0 hour and about 2.5 hours in accordance with some embodiments.

FIG. 13A also illustrates the distance D1 of the gap G1 between the bridge die 305 and the die 205*b*. A similar gap and distance is on the opposite side of the bridge die 305 from the die 205*b* (between the bridge die 305 and the die 205*a*) and the following discussion also applies to that gap. As noted above, the thickness T1 of the bridge die 305 is much less than the thickness T2 of the die 205*b*. Having the thickness T1 of the bridge die 305 be less than the thickness T2 allows the height-to-width ratio of the gap G1 to be controlled by the thickness T1 rather than the thickness T2. For example, for a particular distance D1 of the gap G1, if the thickness T1 were as great as the thickness T2, then the gap G1 may not fill properly due to the extreme height-to-width ratio. Utilizing a thinner thickness T1, however, allows the height-to-width ratio to be decreased because the height-to-width ratio of the gap G1 becomes determinative by the thickness T1. Further, by utilizing the reduced thickness T1, the distance D1 can likewise be reduced to allow better chip density over the dies 105. In some embodiments, the thickness T1 may be between about 15 μm and 50 μm and the thickness T2 may be between about 5 and 20 times the thickness T1, such as between about 100 μm and about 500 μm. In some embodiments, the thickness T2 may be between about 5 and 15 times the thickness T1. The distance D1 of the gap G1 between the bridge die 305 and die 205*b* may be between about 50 μm and 100 μm. So, rather than the height-to-width ratio being between about 2:1 and 10:1, which would be the case if the bridge die 305 had a similar thickness as the die 205*b*, the height-to-width ratio is actually reduced down to between 1:5 and 1:3, as measured to the lesser height of the bridge die 305. The distance D2 between the dies 105 may be between 50 μm and 100 μm.

Embodiments may utilize the landing structures 20*ls* with dies 205 and bridge die 305 having similar thicknesses to each other, may utilize the landing structures 20*s* with dies 205 and bridge die 305 which have different thicknesses, such as illustrated in FIG. 13A, or may omit the landing structures 20*s* and utilize the dies 205 and bridge die 305 which have different thicknesses. An example of utilizing the landing structures 20*ls* with dies having similar thicknesses is provided below.

For embodiments which utilize the landing structures 20*ls*, a call out circle is illustrated in FIG. 13A to show enlarged sections of the interface at the edge of the dies 205 and bridge die 305. As seen in FIG. 13A, the distance D3 corresponds to the width of the landing structure 20*ls*, the distance D4 corresponds to the width of the portion of the landing structure 20*ls* which has an interface with the dielectric bonding layer 252 or 352, and the distance D5 corresponds to the width of the portion of the landing structure 20*ls* which is free from the dies 205 or bridge die 305 or, in other words, laterally protruding from the edge of the dies 205 or bridge die 305. In some embodiments, the distance D3 may be between about 1 μm and 5 μm. The distances D4 and D5 may each be between about 10% and 90% of the distance D3, with their sums adding up to 100% of the distance D3, and with the distance D4 being, at a minimum, about 0.5 μm. The minimum distance of 0.5 μm for the distance D4 provides enough landing for an effective bond at the corners and/or edges of the dies 205 or bridge dies 305 to the landing structures 20*ls*.

Figures 13B, 13C:
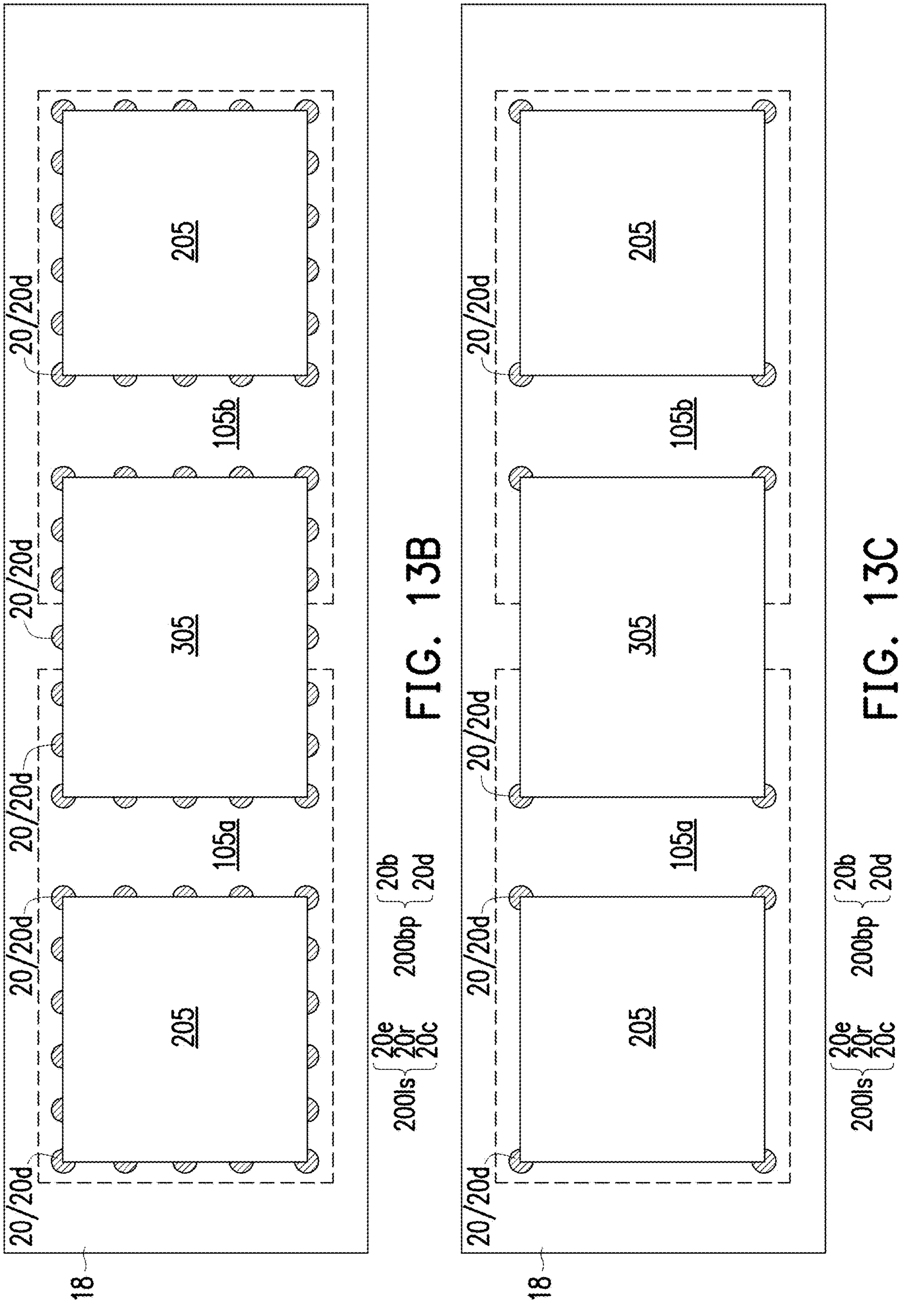
Figures 13D, 13E:
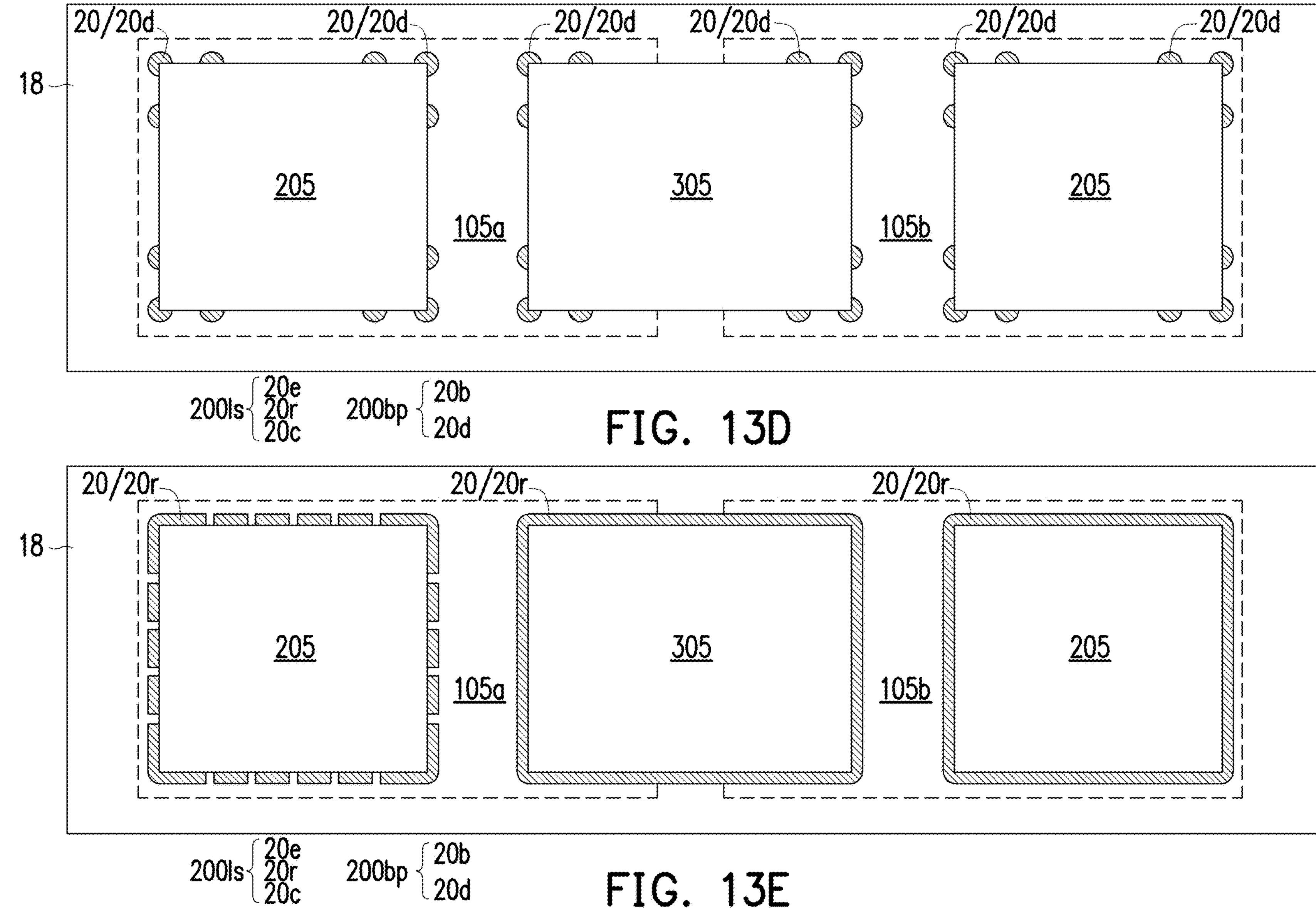

Referring to FIGS. 13B, 13C, 13D, 13E, 13F, and 13G, top down views of the attached dies 205 and bridge die 305 are illustrated, in accordance with various configurations of the bond pads 20*bp* and/or landing structures 20*ls*. In FIG. 13B, the edge landing structures 20*e* continue completely around the periphery of the dies 205 and bridge die 305. In FIG. 13C, the edge landing structures 20*e* are disposed in the corner regions of the dies 205 and bridge die 305. In FIG. 13D, the edge landing structures 20*e* are disposed in the corner regions of the dies 205 and bridge die 305. In addition, at least one of the edge landing structures 20*e* is disposed along the edge of the dies 205 and bridge die 305 between the corner regions. In some embodiments, the interior edge landing structure 20*e* may be spaced apart from the corner edge landing structure 20*e* by the same pitch as a pitch of the bond structures 20 (e.g., bond pads 20*b* and dummy bond pads 20*d*) located interior to the dies 205 and bridge die 305. In embodiments consistent with each of FIGS. 13B, 13C, and 13D, at the corner regions of the dies 205 and bridge die 305, the area of the edge landing structures 20*e* covered has quarter circular or pie wedged shape (when the edge landing structures 20*e* are circular in top down view). In embodiments consistent with each of FIGS. 13B and 13D, the area of the edge landings structures 20*e* bonded at the corner regions may be about half of the area of the edge landing structures 20*e* bonded at edge regions between the corner regions.

Figures 13F, 13G:
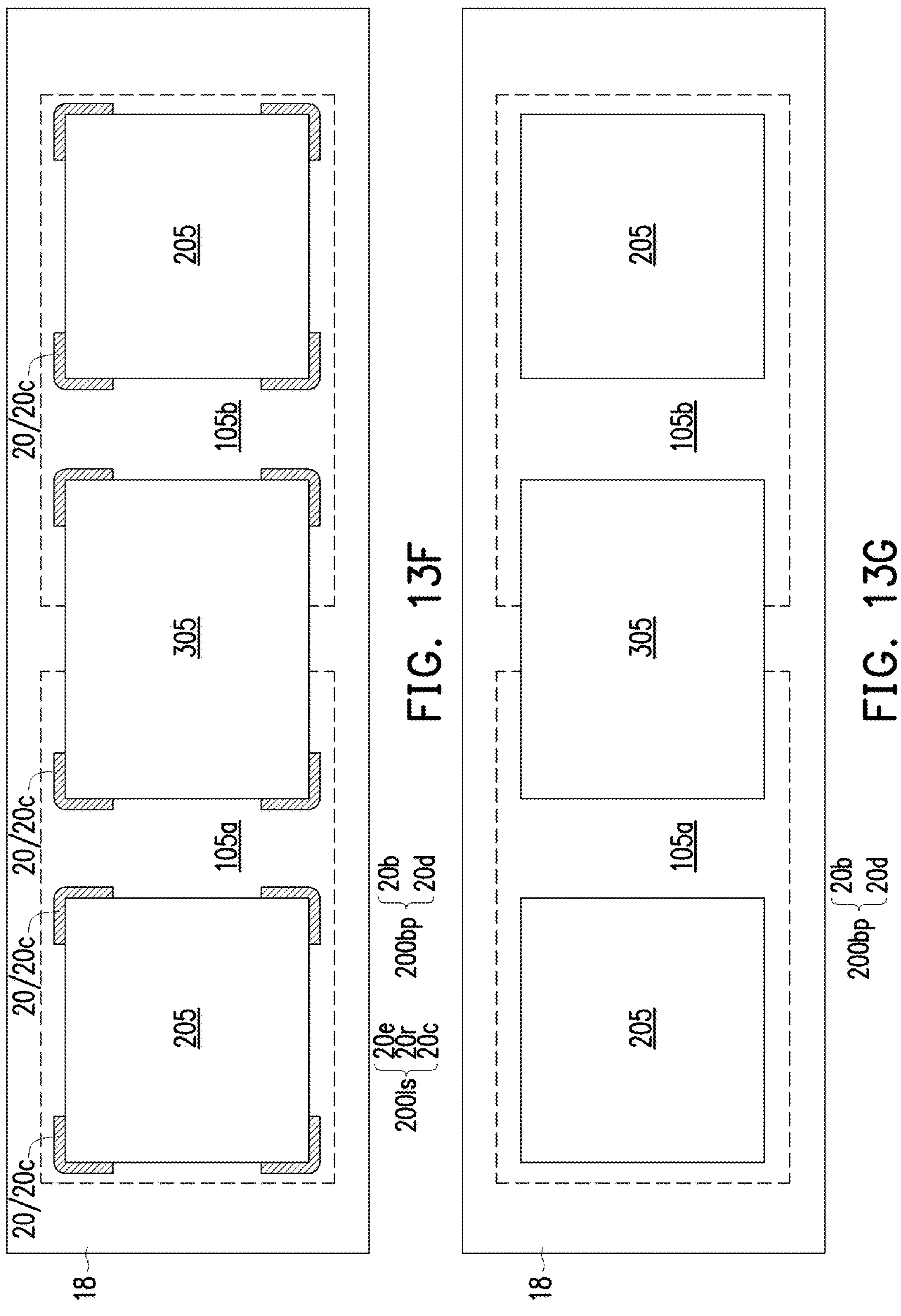

In FIG. 13E, the ring landing structures 20*r* traverse the periphery of the dies 205 and bridge die 305 with a covered portion being bonded to the dies 205 and bridge die 305 and a laterally protruding portion being free from the dies 205 and bridge die 305. In FIG. 13F, the landing structure is a corner landing structure 20*c* disposed in corner regions of the dies 205 and bridge die 305, with a first leg of an L-shaped corner landing structure 20*c* extending along a first edge of the dies 205 and bridge die 305, and a second leg of the L-shaped corner landing structure 20*c* extending along a second edge of the dies 205 and bridge die 305, the first edge intersecting the second edge.

FIG. 13G illustrates an embodiment which does not utilize the landing structures of the bond structures 20. In such embodiments, each of the bond structures 20 are bond pads 20*b* or dummy bond pads 20*d*. As explained above, in this embodiment, the thickness of bridge die 305 is much less than that of the dies 205, whereas in embodiments consistent with those illustrated in FIGS. 13B-13F, the different thickness of the bridge die is optional.

It should be understood that each of the arrangements of dies and landing structures 20*ls* discussed with respect to FIGS. 13B through 13G may be combined without limitation. For example, the dies 205 may utilize landing structures 20*ls* taken from a mix of the FIGS. 13B through 13G (including omitting landing structures 20*ls* for one or more dies 205). Likewise the bridge dies 305 may utilize landing structures 20*ls* taken from a different one of the FIGS. 13B through 13G (including omitting landing structures 20*ls*). In short, any of the landing structures 20*ls* may or may not be used without limitation with any of the dies 205 and bridge die 305.

Figure 14A:
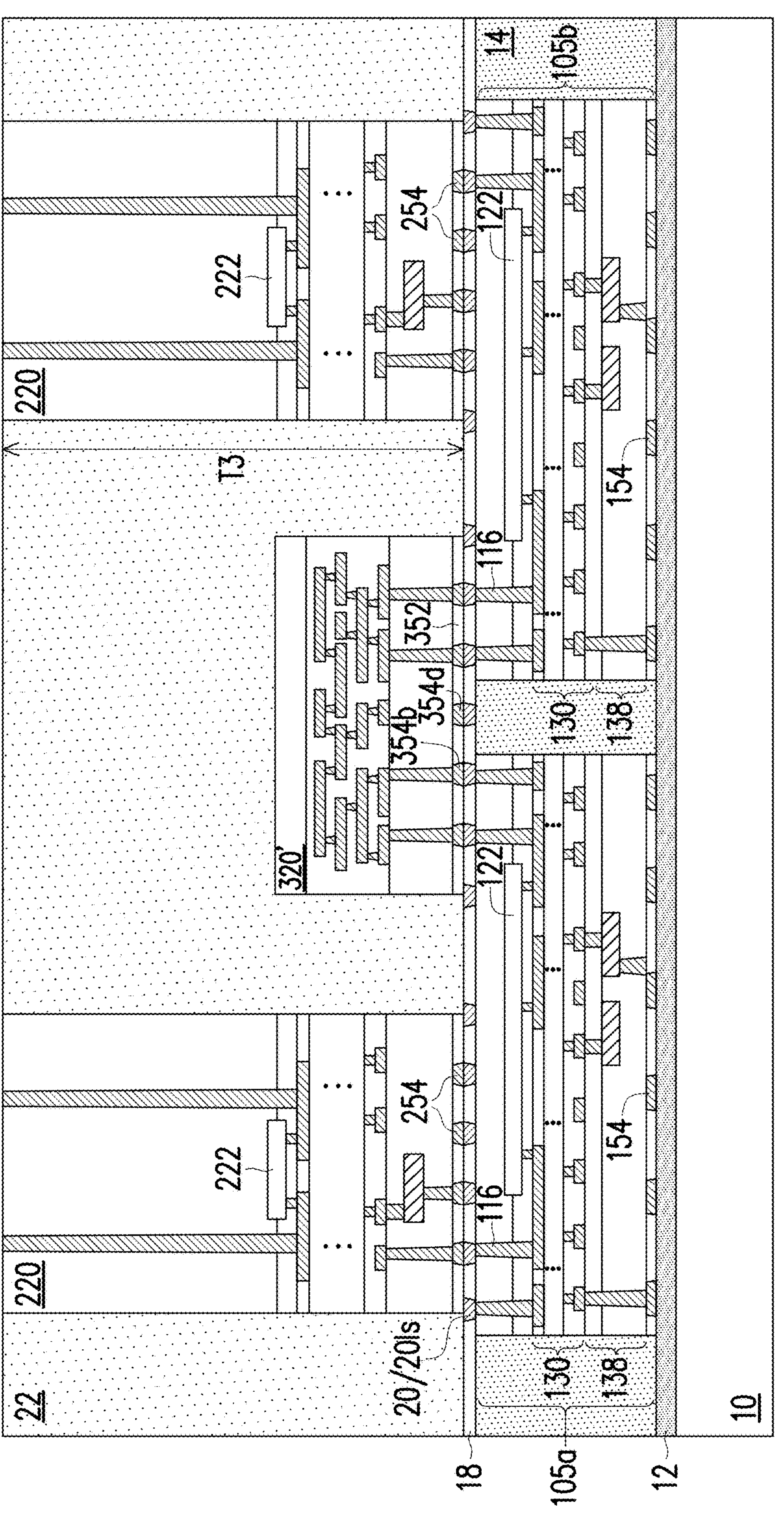
Figure 14B:
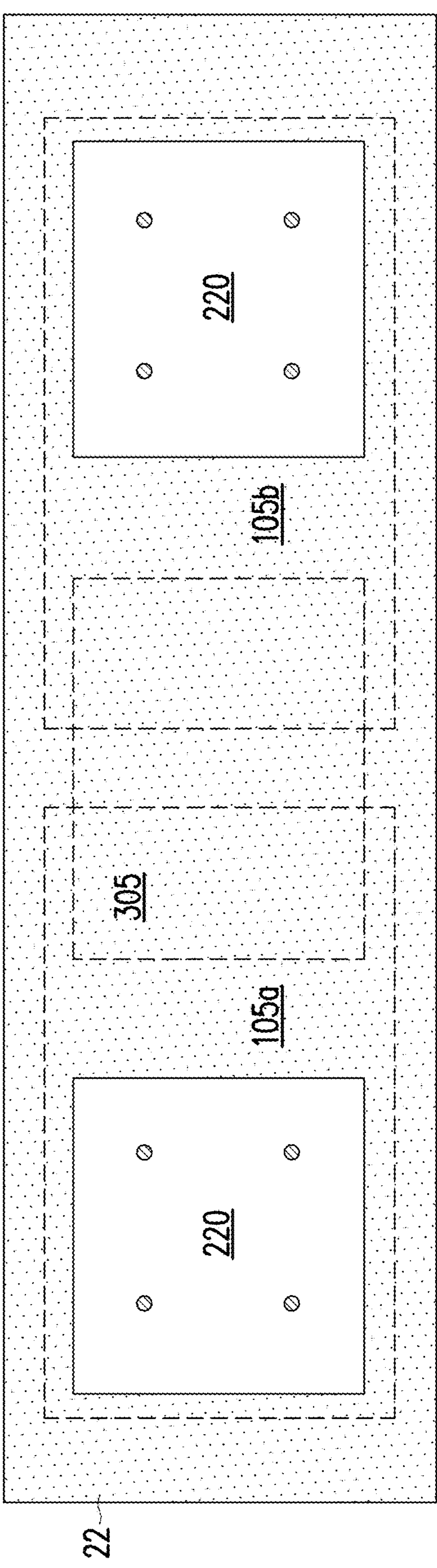

In FIGS. 14A and 14B, a fill material, such as an insulating material or encapsulant 22 may be deposited over and laterally surrounding the dies 205 and bridge die 305. As illustrated in FIG. 14A, and as explained above, because the height-to-width ratio of the gap G1 (see FIG. 13A) between the bridge die and the dies 205 is reduced by reducing the thickness of the bridge die 305, the encapsulant 22 can reliably fill the gap G1 all the way to the bottom of the gap G1. Because the encapsulant 22 can reliably fill the gap G1, it can have an interface with the landing structures 20*ls*, where the landing structures 20*ls* intersect the side of the dies 205 and bridge die 305. The encapsulant 22 may include a dielectric material such as a resin, epoxy, polymer, oxide, nitride, the like, or combinations thereof, which may be deposited by any suitable process, such as by flowable CVD, spin-on, PVD, the like, or combinations thereof.

Also illustrated in FIGS. 14A and 14B, a planarization process may then be used to level the upper surface of the encapsulant 22 with the upper surfaces of the dies 205. Notably, the bridge die 305 remains buried when the thicknesses are different such as illustrated in FIG. 14A. The planarization process may include a grinding and/or a chemical mechanical polishing (CMP) processes. The planarization process may be continued until the TSVs 216 (if used) are exposed through the substrate 220 of the dies 205. This may reduce the thicknesses of the dies 205 from the thickness T2 to a thickness T3. The thickness T3 may be greater than 100 μm such as between about 100 μm and 500 μm. In some embodiments, the thickness T3 may be between about 3 times and 10 times the thickness T1.

In some embodiments, the structure of FIGS. 14A and 14B is merely one package site in a plurality of package sites. For example, the carrier substrate 10 may be a wafer extending beyond the illustrated sidewalls of the encapsulant 14 and additional package areas may be formed adjacent to the illustrated package area. Such package areas may be singulated from one another in a subsequent process. In such embodiments, the encapsulant 14, bonding layer 18, and encapsulant 22 may also extend to the lateral extents of the carrier substrate 10. In other embodiments, the structure illustrated in FIGS. 14A and 14B is a distinct structure and may be individually formed on individual carrier substrates 10.

Figure 15:
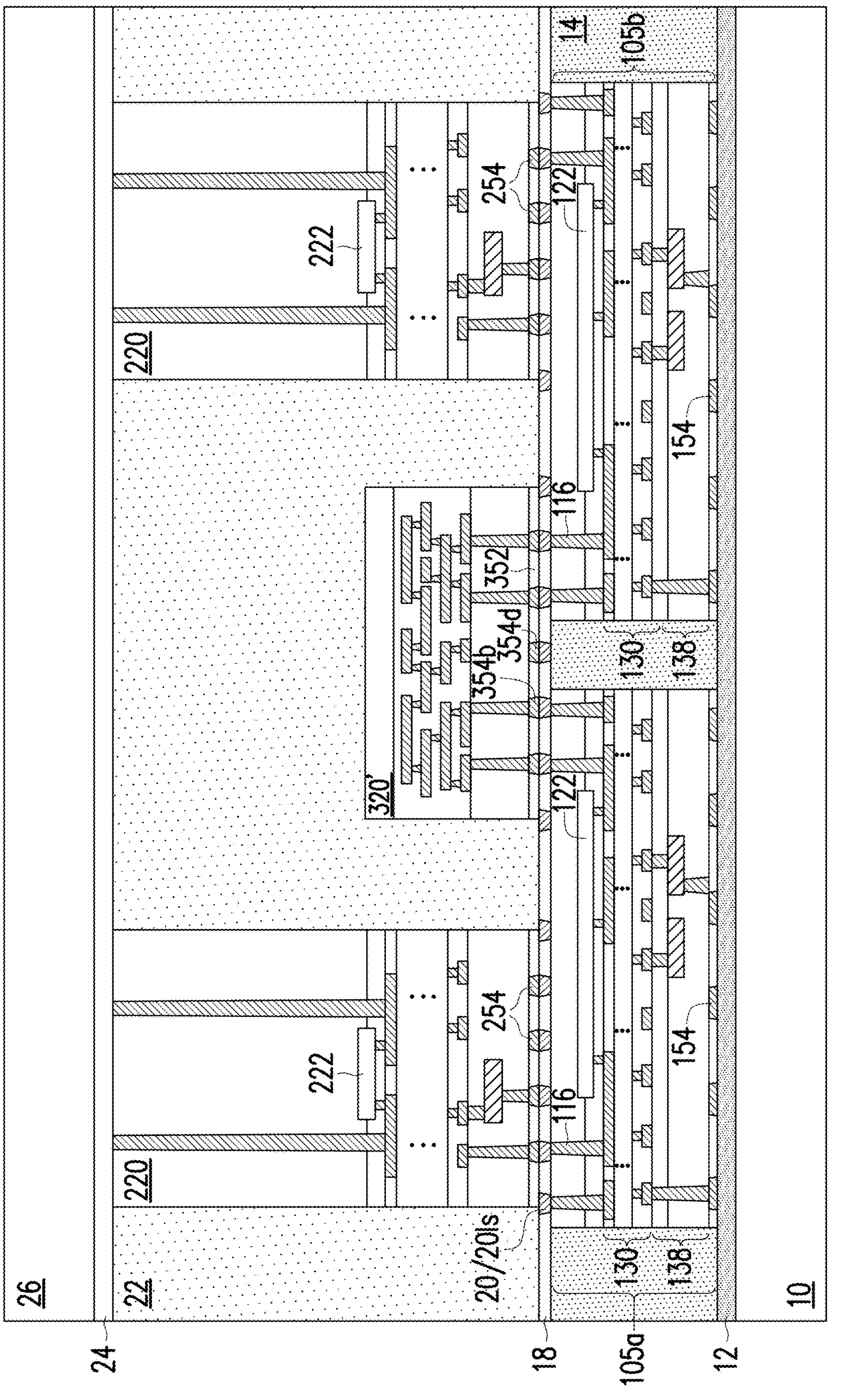

In FIG. 15, an optional wafer bonding layer 24 may be deposited over the structure of FIG. 14A and an optional wafer 26 may be bonded to the structure of FIG. 14A. In some embodiments, the wafer 26 may be a support wafer and may be made of any suitable material, such as silicon, sapphire, or the like. The wafer bonding layer 24 may be deposited using a spin-on technique to achieve a high degree of planarity and the wafer may be pressed against the wafer bonding layer 24 for adhesion thereto. The wafer bonding layer may include any suitable material, such as, silicon oxynitride, silicon carbo-nitride, undoped silicon glass, a TEOS formed silicon oxide, the like, or combinations thereof, deposited by CVD, PECVD, HDP-CVD (high density plasma CVD), and so forth. In some embodiments, the wafer bonding layer may include gold, indium, tin, copper, the like, or combinations thereof, deposited by sputtering, PVD, plating (electro or electroless), and so forth. In yet other embodiments, the wafer bonding layer may include a polymer or glue and may be deposited by spin-on, lamination, and so forth.

Figure 16:
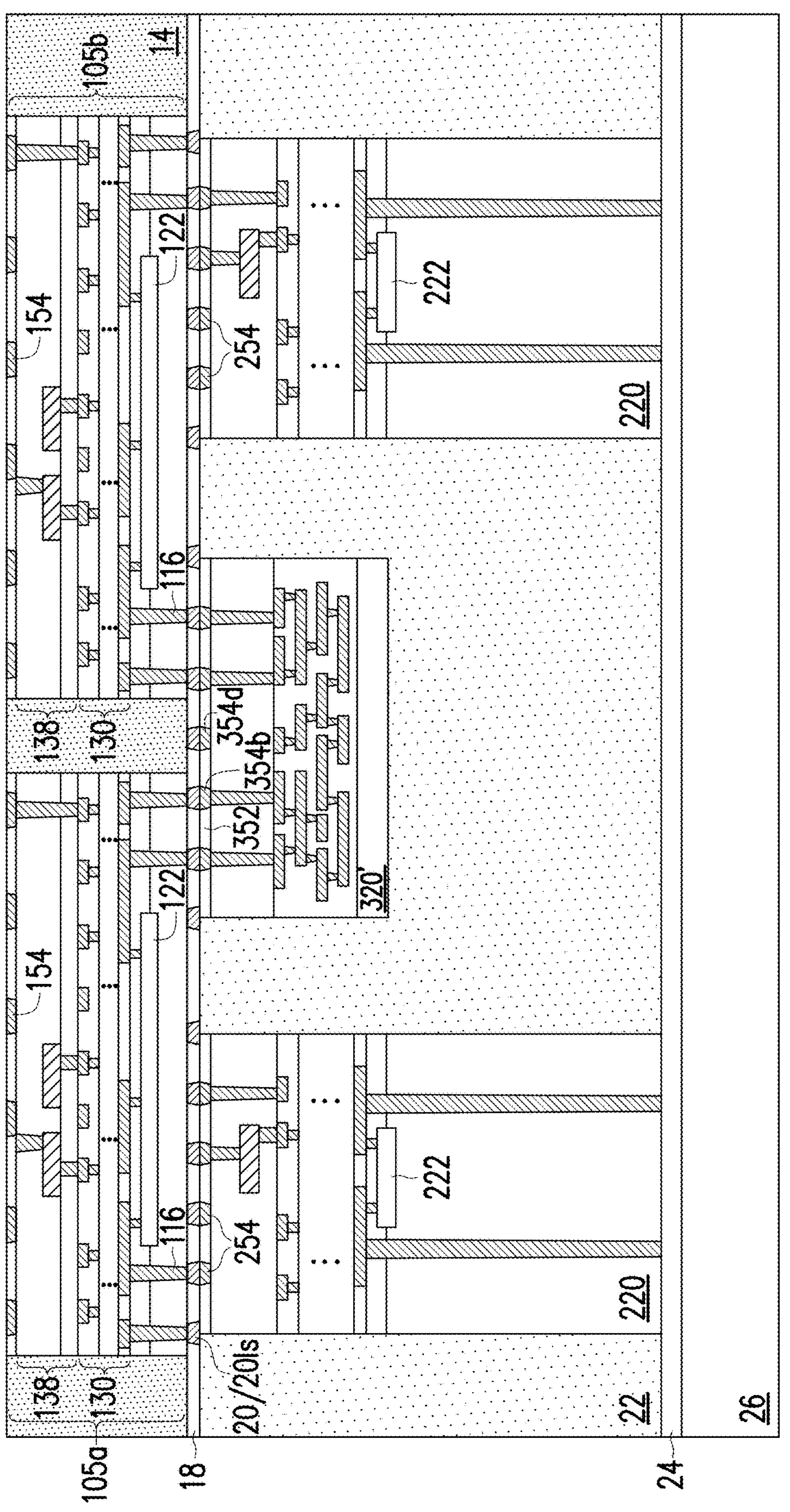

In FIG. 16, a carrier substrate de-bonding is performed to detach (or "de-bond") the carrier substrate 10 from the front side of the dies 105 and encapsulant 14. In accordance with some embodiments, the de-bonding includes projecting a light such as a laser light or an UV light on the release layer 12 so that the release layer 12 decomposes under the heat of the light and the carrier substrate 10 can be removed. The structure may then flipped over and placed on a tape (not shown).

Figure 17:
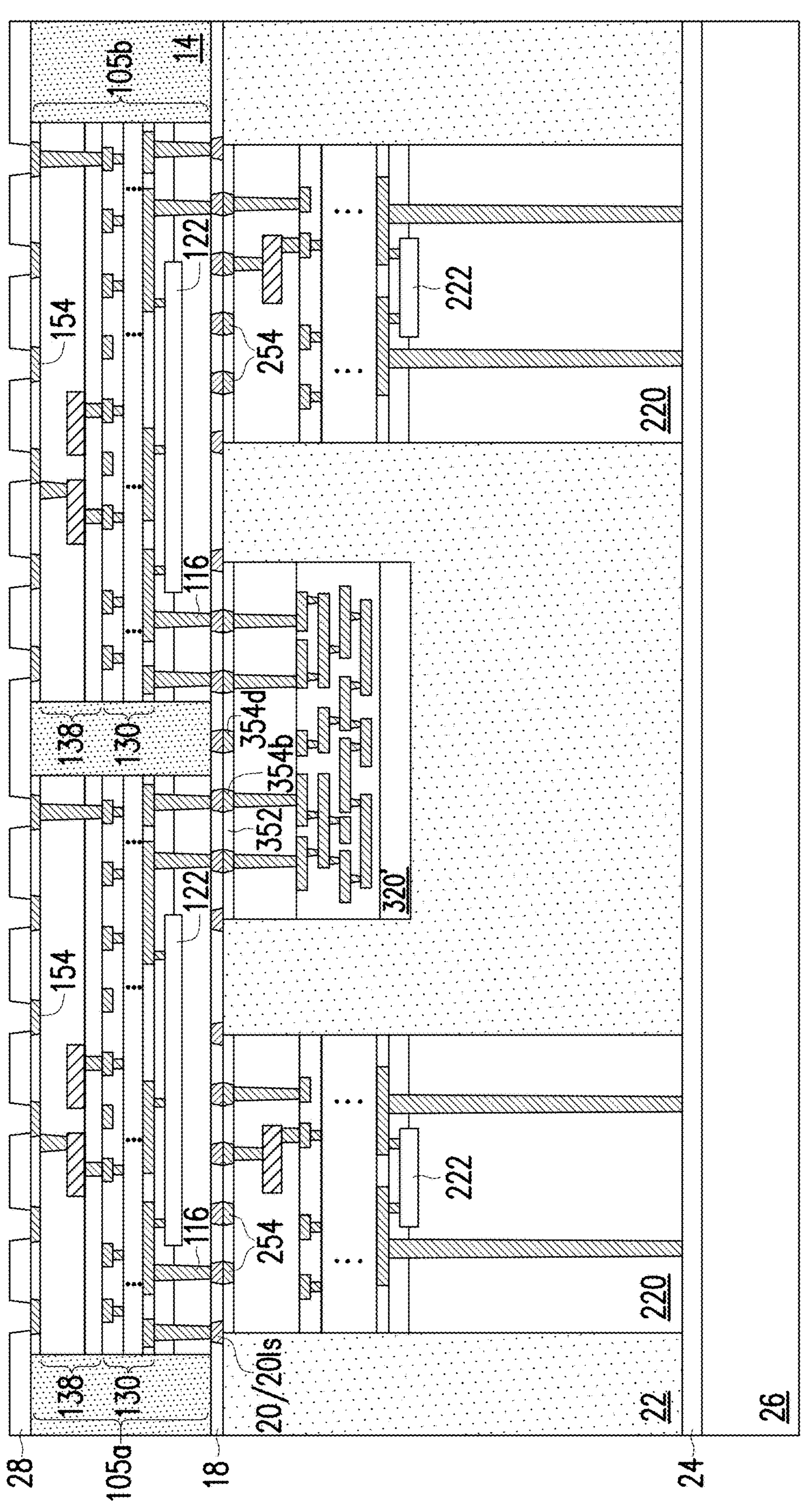

In FIG. 17, a passivation layer 28 is formed over the front side of the device dies 105*a* and 105*b* and the encapsulant 14. The passivation layer 28 may be a single layer or a composite layer, and may be formed of a non-porous material. In some embodiments, the passivation layer 28 is a composite layer including a silicon oxide layer (not shown separately), and a silicon nitride layer (not shown separately) over the silicon oxide layer. The passivation layer 28 may also be formed of other non-porous dielectric materials such as undoped Silicate Glass (USG), silicon oxynitride, and/or the like. The passivation layer 28 may also be formed of polyimide, polybenzoxazole (PBO), or the like. The passivation layer 28 may be deposited by any suitable technique, such as by PVD, CVD, spin-on, the like, or combinations thereof. The passivation layer 28 may then be patterned, so that openings in the passivation layer 28 expose the bond structures 154 of the device dies 105*a* and 105*b*.

Figure 18:
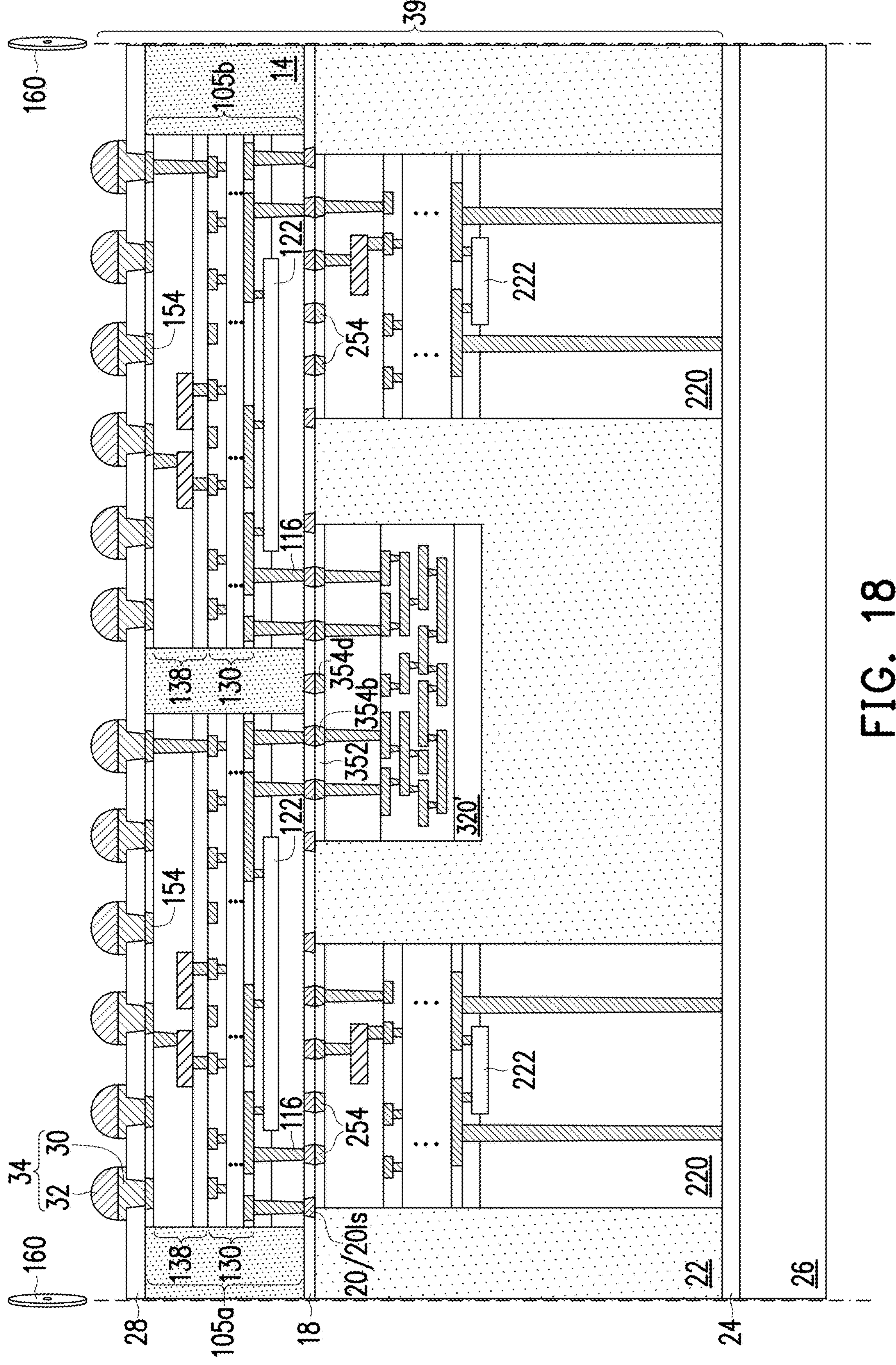

In FIG. 18, conductive connectors 34 are formed in the openings of the passivation layer 28. In some embodiments, the conductive connectors 34 may include optional under bump metallurgies (UBMs) extending through the passivation layer 28 to physically and electrically couple the bond structures 154. The UBMs may be formed of the same material as the bond structures 154. The conductive connectors 34 may include ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 34 may include a conductive material such as solder, copper, aluminum, gold, nickel, silver, palladium, tin, the like, or a combination thereof. The conductive connectors 34 may be formed by sputtering, printing, electro plating, electroless plating, CVD, or the like. The conductive connectors 34 may be solder free and have substantially vertical sidewalls. In some embodiments, the conductive connectors 34 include a metal pillar 30 and a metal cap layer 32 formed on the top of the metal pillar 30. The metal cap layer 32 may include nickel, tin, tin-lead, gold, silver, palladium, indium, nickel-palladium-gold, nickel-gold, the like, or a combination thereof and may be formed by a plating process.

A singulation process 160, such as described above, can be used to separate the package regions into multiple package devices 395, each of which including dies 105, dies 205, bridge die 305, and conductive connectors 34. If used, the wafer 26 may be removed or may be left in place. The wafer 26 may be removed by a grinding, etching, or planarization process, or combination thereof. In some embodiments, the wafer bonding layer 24 may be light sensitive and a debonding process may include utilizing a UV light, to debond the wafer 26.

Figure 19:
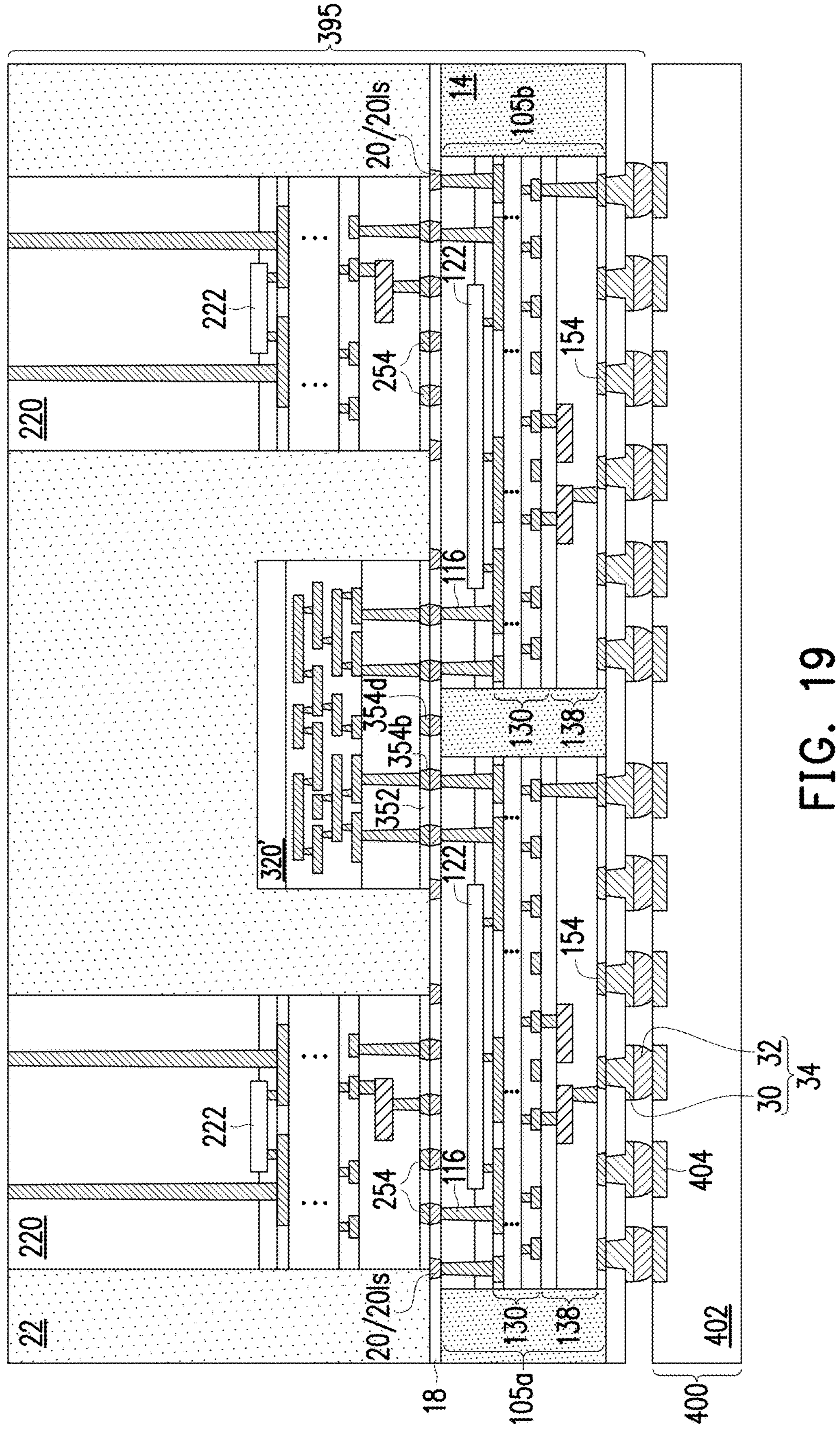

In FIG. 19, the package device 395 is attached to a package substrate 400 using the conductive connectors 34. The package substrate 400 may be a printed circuit board (PCB). The package substrate 400 may include a substrate core 402 and bond pads 404 over the substrate core 402. An optional redistribution structure (not shown) may also be used over the substrate core 402. The substrate core 402 may be made of a semiconductor material such as silicon, germanium, diamond, or the like.

Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 402 may be an SOI substrate. Generally, an SOI substrate includes a layer of a semiconductor material such as epitaxial silicon, germanium, silicon germanium, SOI, SGOI, or combinations thereof. The substrate core 402 may be an organic substrate. The substrate core 402 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 402.

The substrate core 402 may include active and passive devices (not shown). A wide variety of devices such as transistors, capacitors, resistors, combinations of these, and the like may be used to generate the structural and functional requirements of the design for the device stack. The devices may be formed using any suitable methods.

In some embodiments, the conductive connectors 34 are reflowed to electrically couple and physically attach the package device 395 to the bond pads 404. In some embodiments, a solder resist (not shown) is formed over the substrate core 402, and the conductive connectors 34 may be disposed in openings in the solder resist to be electrically and mechanically coupled to the bond pads 404. The solder resist may be used to protect areas of the substrate core 402 and/or bond pads 404 from external damage.

FIGS. 20A-20F through FIG. 25 illustrate intermediate stages in the formation of a package that utilizes landing structures, in accordance with other embodiments. These Figures do not utilize a bridge die 305, but do illustrate two variations on the embodiments illustrated above, both of which can be incorporated into the above embodiments which utilize the bridge die 305. The first variation is that the dies 105 are used face up. Above, the dies 105 are used face down Also, because a bridge die is not used, they are not illustrated as having been singulated prior to use. In other words, the wafer 100 includes each of the dies 105 (e.g., die 105*a* and die 105*b*) prior to singulation. It should thus be understood that the above embodiments can utilize face up dies 105. The details of how to use them face up may be taken from the description below. The second variation is that the dies 205 have about the same thicknesses. As noted above, the bridge die 305 may be altered to have the same thicknesses as the dies 205. As such, it should be understood from the following discussion how to utilize the dies with the landing structures 20*ls* (above) when the dies have the same thicknesses.

For the following description, like references are used to refer to like elements. Thus, the discussion of these elements is abbreviated and one may refer to the above for details regarding the like elements. It is also noted that because the dies 105 are face up, the bond pads 154*bp* (including active bond pads 154*b* and dummy bond pads 154*d*) are used instead of the bond pads 20*bp* (including active bond pads 20*b* and dummy bond pads 20*d*) and likewise the landing structures 154*ls* (dummy structures which include edge landing structures 154*e*, ring landing structures 154*r*, and corner landing structures 154*c*) are used instead of the landing structures 20*ls* (including edge landing structures 20*e*, ring landing structures 20*r*, and corner landing structures 20*c*).

Figure 20B:
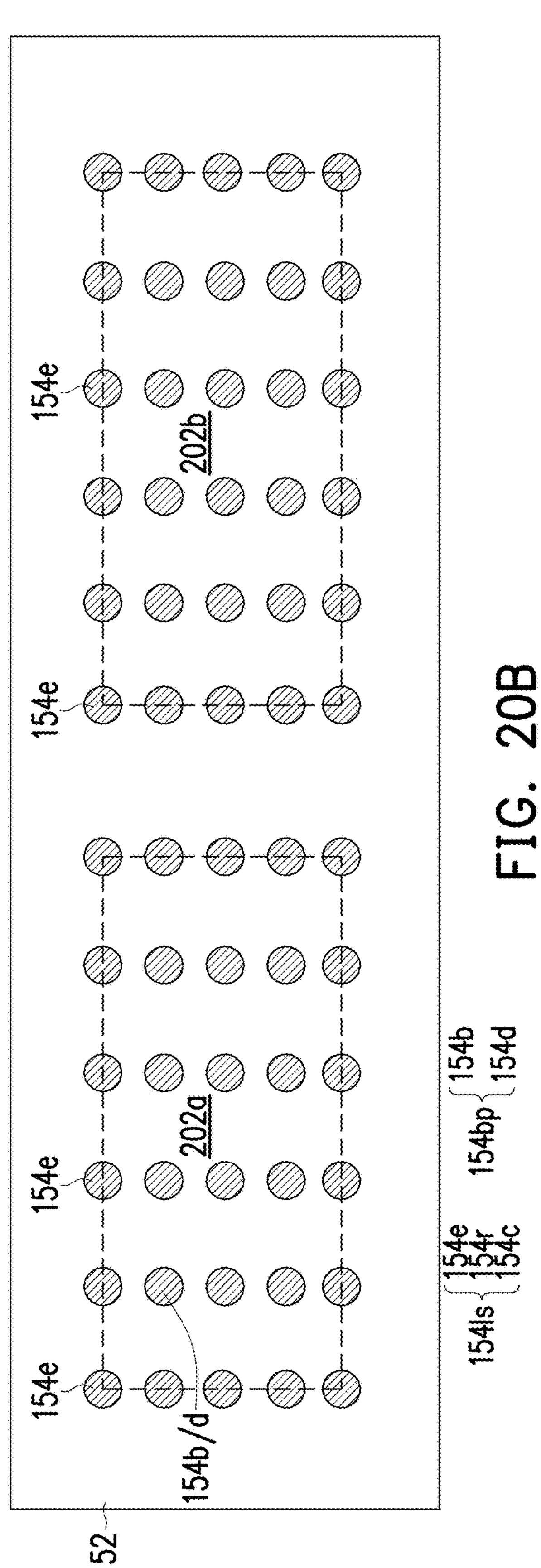
FIGS. 20A, 20B, 20C, 20D, 20E, 20F, 21A, 21B, 21C, 21D, 21E, 21F, 22, 23, 24, and 25 illustrate intermediate stages for forming a package structure utilizing various configurations of die landing structures, in accordance with some embodiments.
Figure 20A:
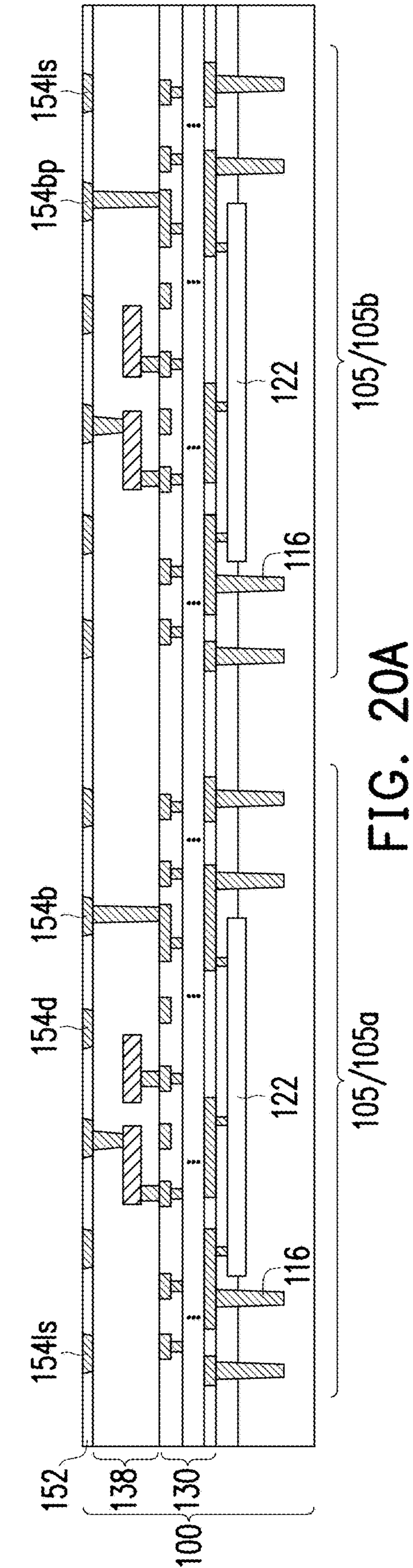

FIG. 20A illustrates the dies 105 (e.g. die 105*a* and die 105*b*) formed in corresponding regions of a wafer 100. This structure is similar to the structure of FIG. 3 and the details are omitted. Rather than singulate the dies 105 out of the wafer 100, however, they are left intact for the present time. However, in some embodiments, the dies 105 may be singulated and attached to a carrier, such as described above with respect to FIG. 4, however they may be attached face up and laterally encapsulated.

FIG. 20A is a cross-sectional view and FIGS. 20B, 20C, 20D, 20E, and 20F illustrate top down views of the structure of FIG. 12A according to various embodiments, the various embodiments demonstrating different configurations of the bond structures 154 (including landing structures 154*ls* and bond pads 154*bp*). The bond structures 154 may include active bond pads 154*b* which are physically coupled to a via 156 or 157 (see FIG. 3), dummy bond pads 154*d* which are not connected to any metal features of the dies 105, edge landing structures 154*e* which are a particular type of dummy bond pad which is disposed at a periphery of a die attach area, ring landing structures 154*r* which are ring-like metal lines disposed around and overlapping a periphery of the die attach area, and corner landing structures 154*c* which are L-shaped metal lines disposed at corners of the die attach area. The bond pads 154*bp* may include active bond pads 154*b* and/or dummy bond pads 154*d*.

Referring to FIGS. 20B, 20C, 20D, 20E, and 20F, a die attach area 202*a* (shown in dashed lines) is at an upper surface of the die 105*a*. Similarly, a die attach area 202*b* (shown in dashed lines) is at an upper surface of the die 105*b*. The bond structures 154 entirely within the die attach areas 202*a* and 202*b* may be active bond pads 154*b* and/or dummy bond pads 154*d*. For the sake of simplicity, these may be referred to as bond pads 154*bp*. The bond structures 154 disposed at the edge of the die attach areas 202*a* and 202*b* may be edge landing structures 154*e*, ring landing structures 154*r*, or corner landing structures 154*c*. These may be referred to as landing structures 154*ls*. Each of these landing structures 154*ls* are disposed at an edge and/or corner of the die attach areas 202*a* and 202*b* and are partially within the die attach areas and partially outside the die attach areas.

In a subsequent process, device dies are attached to the die attach areas 202*a* and 202*b* and bonded to the active bond pads 154*b* and dummy bond pads 154*d*. An edge of the device dies land on the landing structures 154*ls* (including the edge landing structures 154*e*, ring landing structures 154*r*, and/or corner landing structures 154*c*) and a dielectric material at an edge of the device dies and/or bridge dies is adjoined to the landing structures 154*ls*, in accordance with some embodiments, as explained below.

In FIG. 20B, the edge landing structures 154*e* are like unto the edge landing structures 20*e* of FIG. 12B and continue completely around the periphery of the die attach areas 202*a* and 202*b*. The edge landing structures 154*e* continue at a same size and pitch as the bond pads 154*bp*.

Figures 20C, 20D:
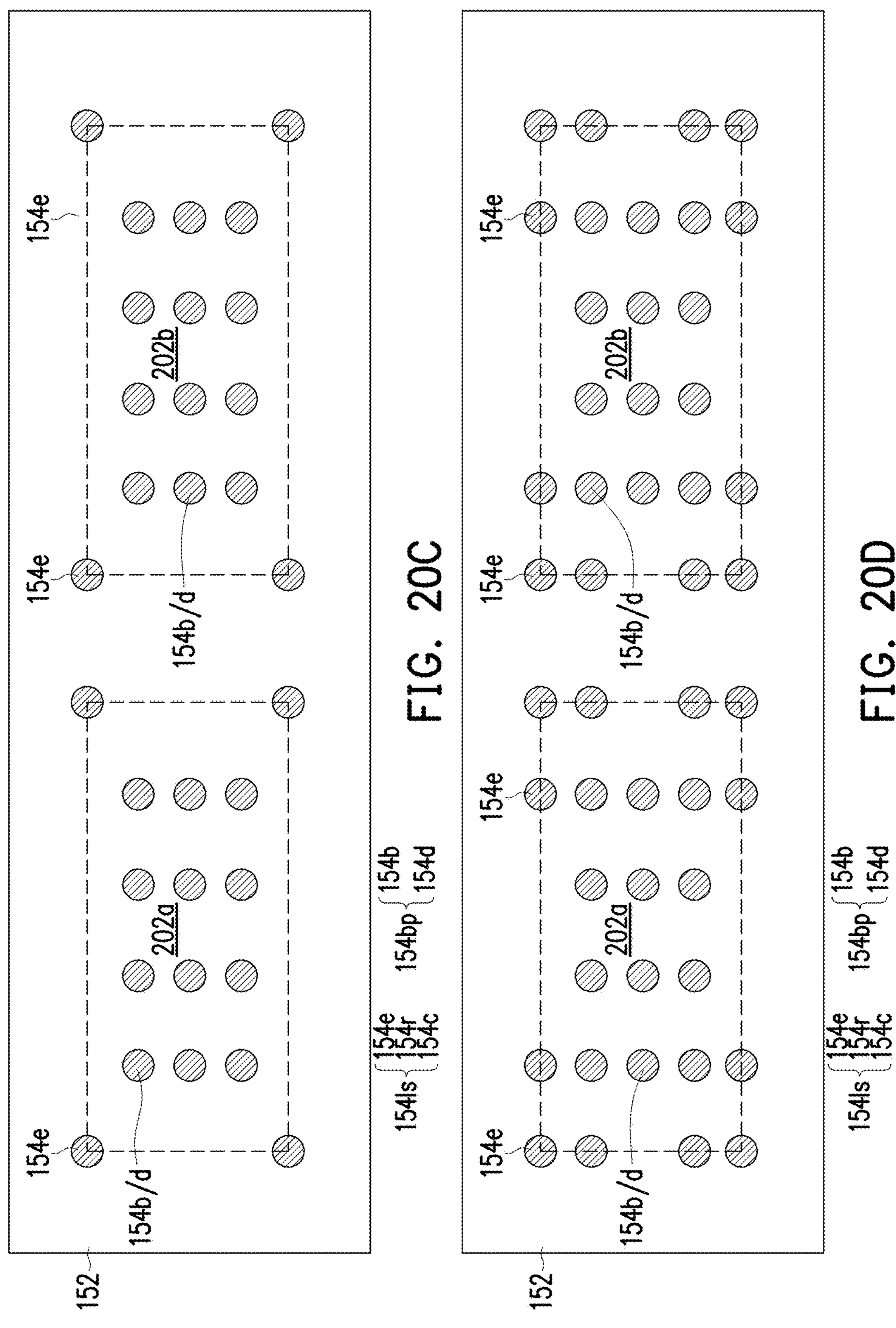

In FIG. 20C, the edge landing structures 154*e* are disposed only at the corners of the die attach areas 202*a* and 202*b*, like unto the edge landing structures 20*e* of FIG. 12C.

In FIG. 20D, the edge landing structures 154*e* like unto the edge landing structures 20*e* of FIG. 12D and are disposed at the corners of the die attach areas 202*a* and 202*b*. In addition, at least one edge landing structures 154*e* is located on the periphery of the die attach areas 202*a* and 202*b* in each direction from the corner edge landing structures 154*e*.

Figures 20E, 20F:
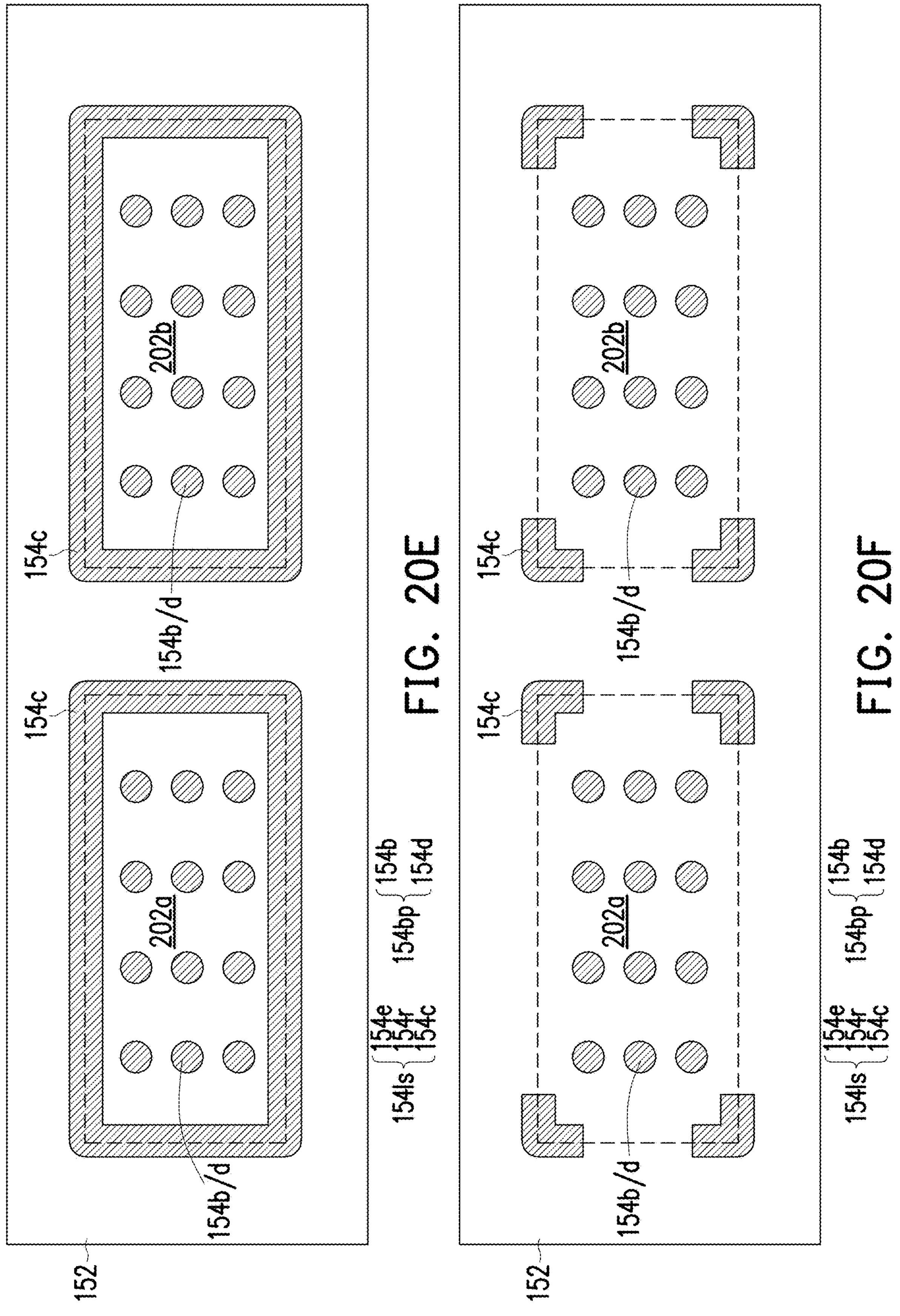

In FIG. 20E, instead of using edge landing structures 154*e*, the landing structures 154*ls* are a ring landing structure 154*r*, like unto the ring landing structure 20*r* of FIG. 12E. The ring landing structure 20*r* traverses the periphery of the die attach areas 202*a* and 202*b*. In some embodiments, the ring landing structure 20*r* may be a broken ring or segmented ring, such as illustrated above with respect to FIG. 12E with respect to the corresponding die attach area 202*a*, which looks like disjointed line segments in a top down view.

In FIG. 20F, the landing structure is a corner landing structure 154*c*, like unto the corner landing structure 20*c*, such as illustrated above with respect to FIG. 12F.

In FIGS. 21A, 21B, 21C, 21D, 21E, and 21F, dies 205 (e.g., die 205*a* and 205*b*) may be coupled to the die attach areas (e.g., die attach areas 202*a* and 202*b*) of the dies 105 (e.g., die 105*a* and die 105*b*). The dies may be attached in a manner similar to that described above with respect to FIGS. 13A, 13B, 13C, 13D, 13E, and 13F, respectively. However, for embodiments consistent with that illustrated in FIGS. 21A, 21B, 21C, 21D, 21E, and 21F, the dies 205 and dies 105 are face-to-face rather than face-to-back. In particular, the dies 205 may be bonded to the dies 105 by a direct bonding process, without solder materials, such that bond pads 254 are directly bonded to bond pads 154*bp*, the dielectric bonding layer 252 is fused or bonded to the dielectric bonding layer 152, and portions of the dielectric bond layer 252 are be adjoined to the landing structures 154*ls* (similar to that described for adjoining to the landing structures 20*ls*, above, and thus not repeated).

Figures 21A, 21B:
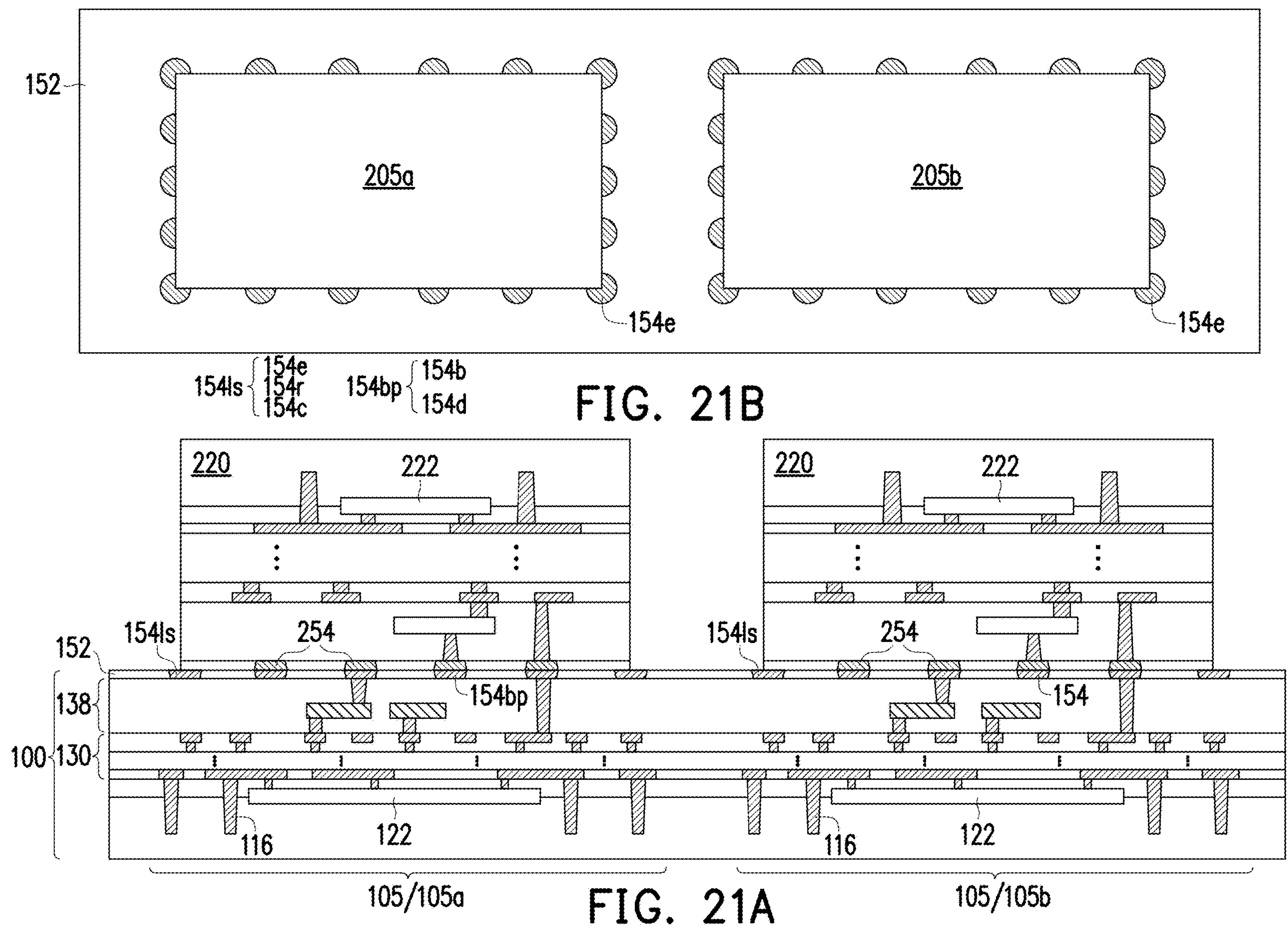
Figures 21C, 21E:
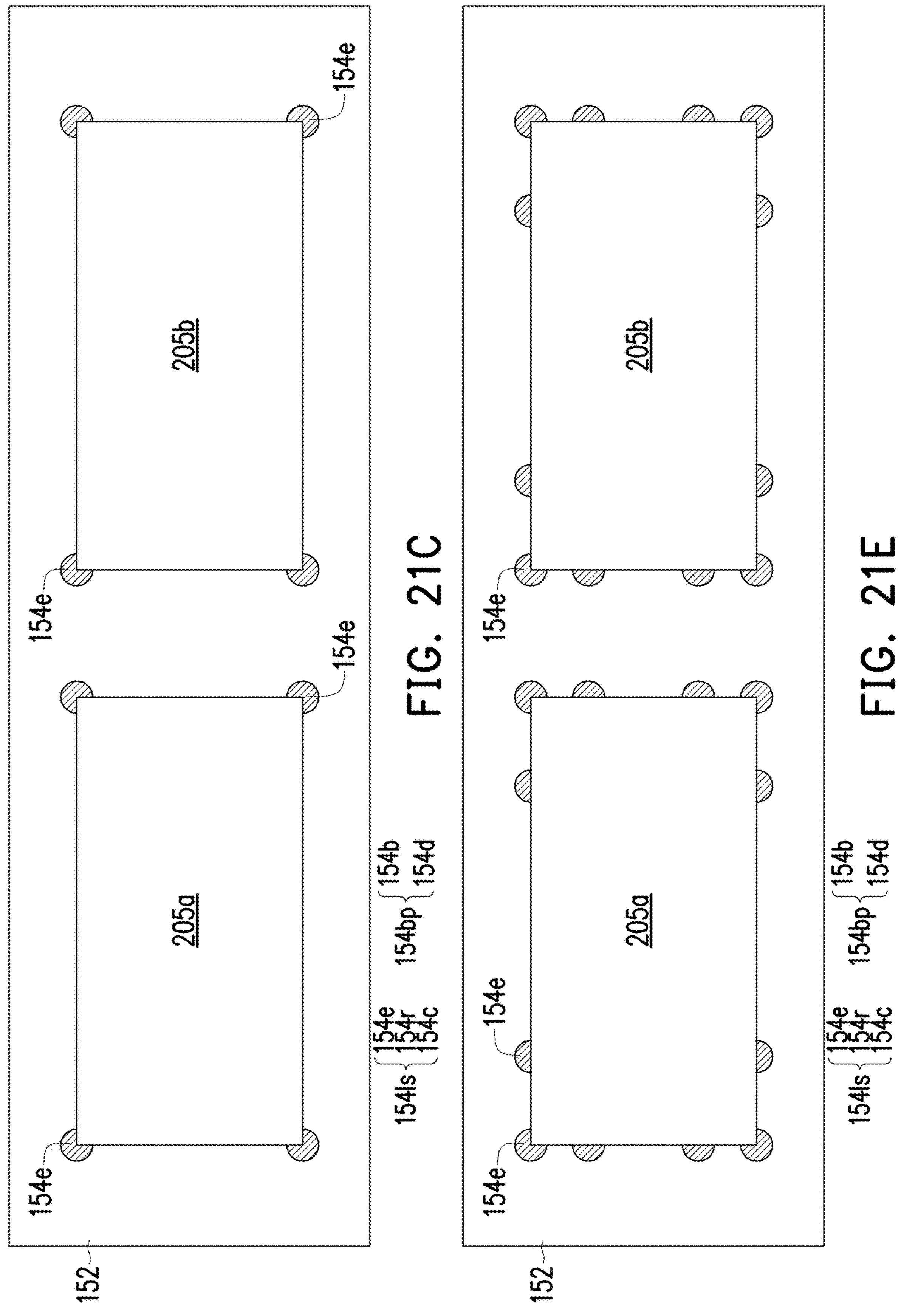
Figures 21D, 21F:
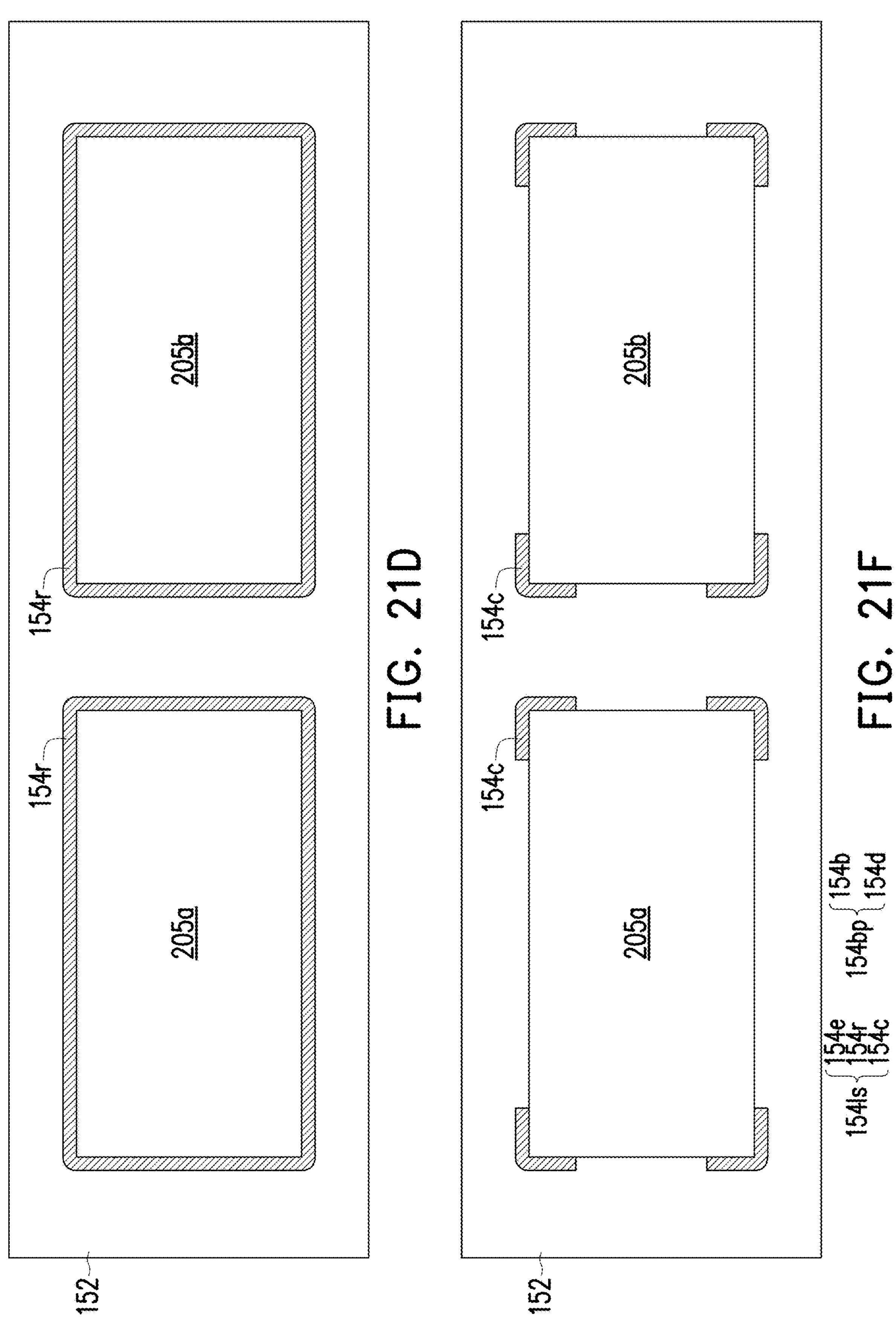

Referring to FIGS. 21B, 21C, 21D, 21E, and 21F, top down views of the attached dies 205 are illustrated, in accordance with various configurations of the bond pads 154*bp* and/or landing structures 154*ls*. In FIG. 21B, the edge landing structures 154*e* continue completely around the periphery of the dies 205. In FIG. 21C, the edge landing structures 154*e* are disposed in the corner regions of the dies 205. In FIG. 21D, the edge landing structures 154*e* are disposed in the corner regions of the dies 205. In addition, at least one of the edge landing structures 154*e* is disposed along the edge of the dies 205 between the corner regions. In some embodiments, the interior edge landing structure 154*e* may be spaced apart from the corner edge landing structure 154*e* by the same pitch as a pitch of the bond pads 154*bp* located interior to the dies 205. In embodiments consistent with each of FIGS. 21B, 21C, and 21D, at the corner regions of the dies 205, the area of the edge landing structures 154*e* covered has quarter circular or pie wedged shape (when the edge landing structures 154*e* are circular in top down view). In embodiments consistent with each of FIGS. 21B and 21D, the area of the edge landings structures 154*e* bonded at the corner regions may be about half of the area of the edge landing structures 154*e* bonded at edge regions between the corner regions.

In FIG. 21E, the ring landing structures 154*r* traverse the periphery of the dies 205 with a covered portion being bonded to the dies 205 and a laterally protruding portion being free from the dies 205. In FIG. 21F, the landing structure is a corner landing structure 154*c* disposed in corner regions of the dies 205, with a first leg of an L-shaped corner landing structure 154*c* extending along a first edge of the dies 205, and a second leg of the L-shaped corner landing structure 154*c* extending along a second edge of the dies 205, the first edge intersecting the second edge.

Figure 22:
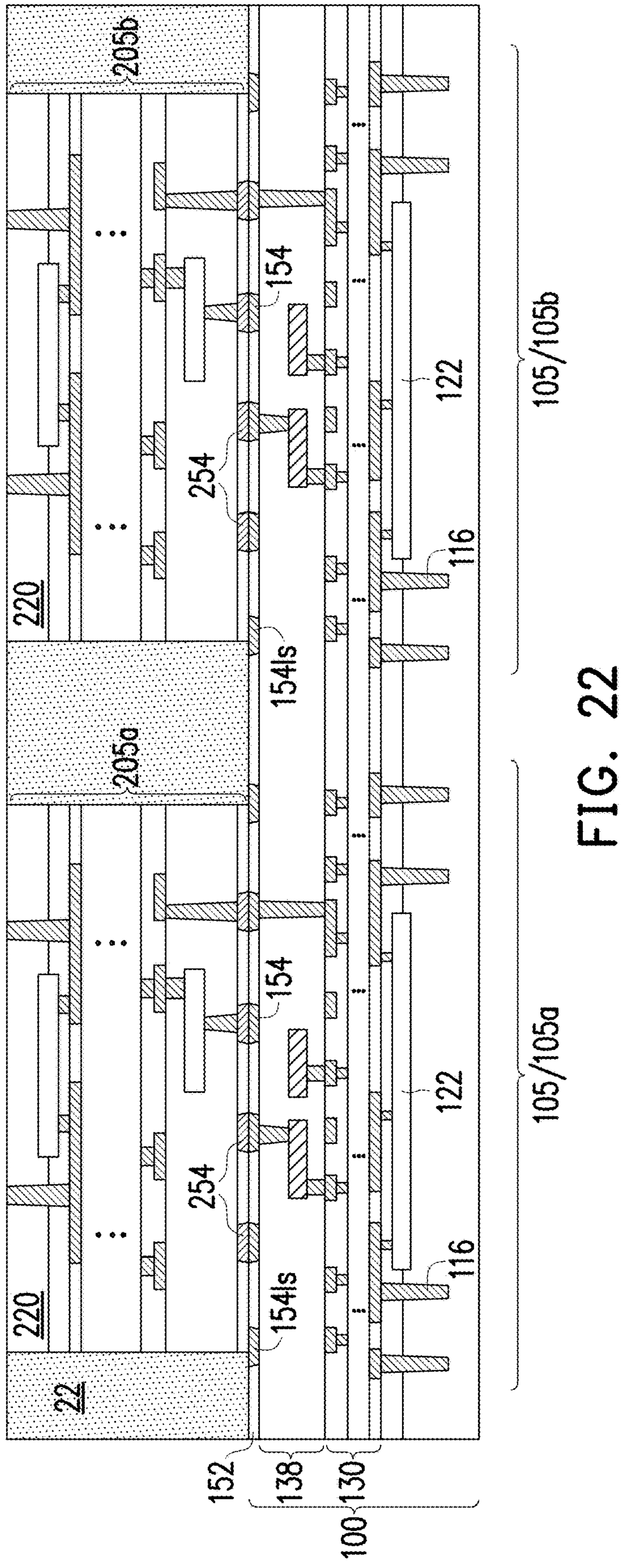

In FIG. 22, a fill material, such as an insulating material or encapsulant 22 may be deposited over and laterally surrounding the dies 205. Also illustrated in FIG. 22, a planarization process may then be used to level the upper surface of the encapsulant 22 with the upper surfaces of the dies 205, where the planarization process is similar to that described above with respect to FIGS. 14A and 14B. The TSVs 216 (see FIG. 5) may be exposed by the planarization process.

Figure 23:
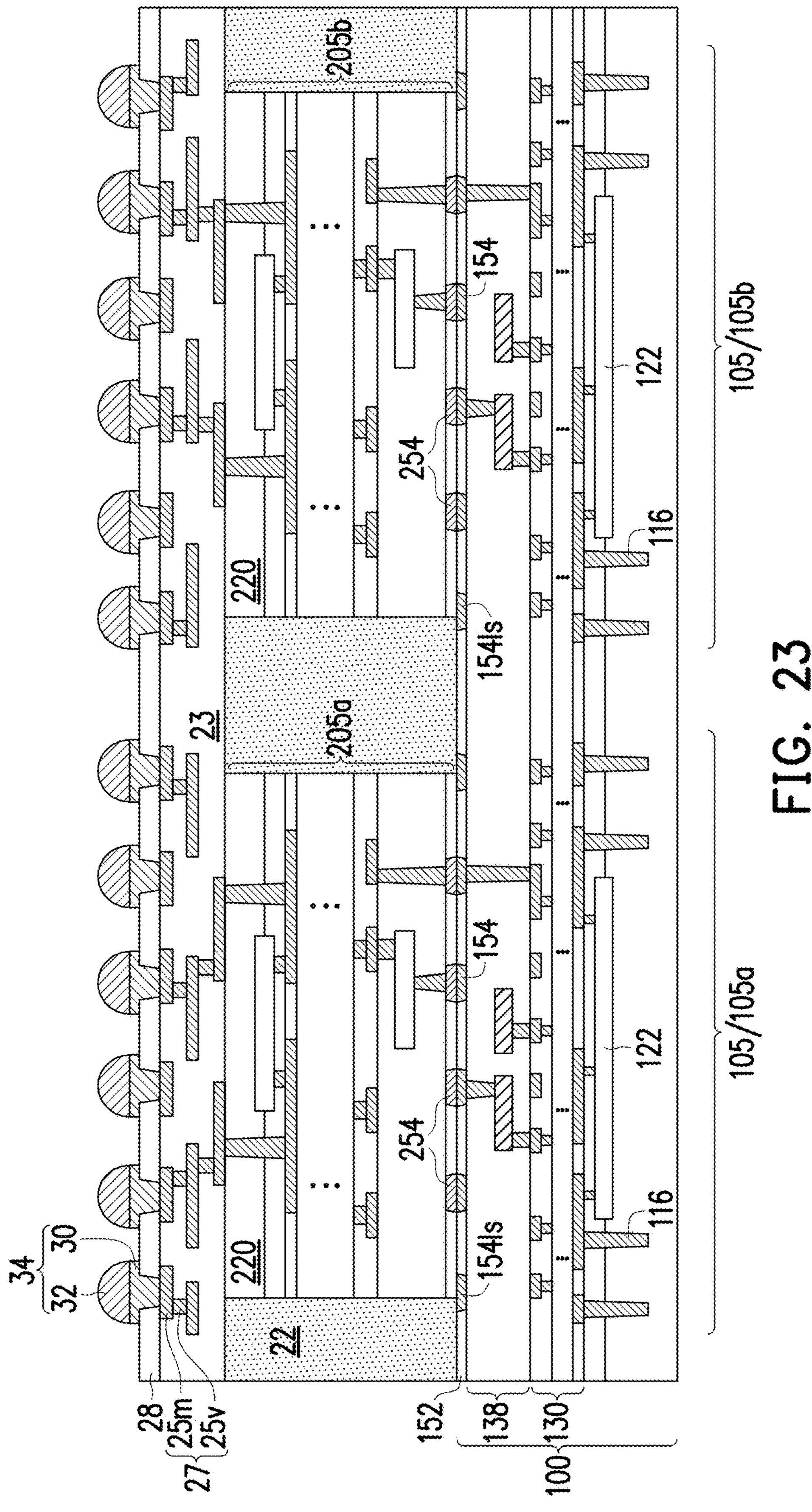

In FIG. 23, a redistribution structure 27 is formed over the encapsulant 22 and over the dies 205. The redistribution structure 27 can electrically couple signals from the TSVs 216 and/or other signals to subsequently formed conductive connectors. The redistribution structure 27 can be formed by a damascene or dual damascene process using alternating dielectric layers 23 to form metallization patterns 25*m* and vias 25*v* through the dielectric layers 23 to couple the metallization patterns 25*m*. As an example for forming the redistribution structure 27, a first layer of the dielectric layers 23 may be formed on the encapsulant 22 and on the dies 205. Then, openings may be formed in the dielectric layers 23 to expose the TSVs 216 or other conductive features using acceptable photoetching processes. The vias 25*v* and metallization patterns 25*m* may be formed in a same process, for example, by depositing a blanket seed layer over the dielectric layers 23 and in the openings and on the TSVs 216 and other conductive features, for example, by PVD, CVD, sputtering, or the like. Then, a photoresist may be formed by spin coat over the seed layer and patterned, leaving openings to the seed layer where the metallization patterns 25*m* will be deposited. Next, a conductive material of the metallization patterns 25*m* is deposited on the exposed seed layer, for example, by a electroplating or electrochemical process. Then, the photoresist may be removed and the now exposed seed layer removed, for example, by an etching process. Another layer of the dielectric layers 23 may then be deposited and additional metallization patterns 25*m* and vias 25 formed over and through the next layer of the dielectric layers 23. The process may be repeated for any desired number of layers of the redistribution structure 27.

Next, the passivation layer 28 and conductive connectors 34 may be formed over the structure and through openings in the passivation layer 28. The passivation layer 28 and conductive connectors 34 may be formed according to the materials and processes described above.

Figure 24:
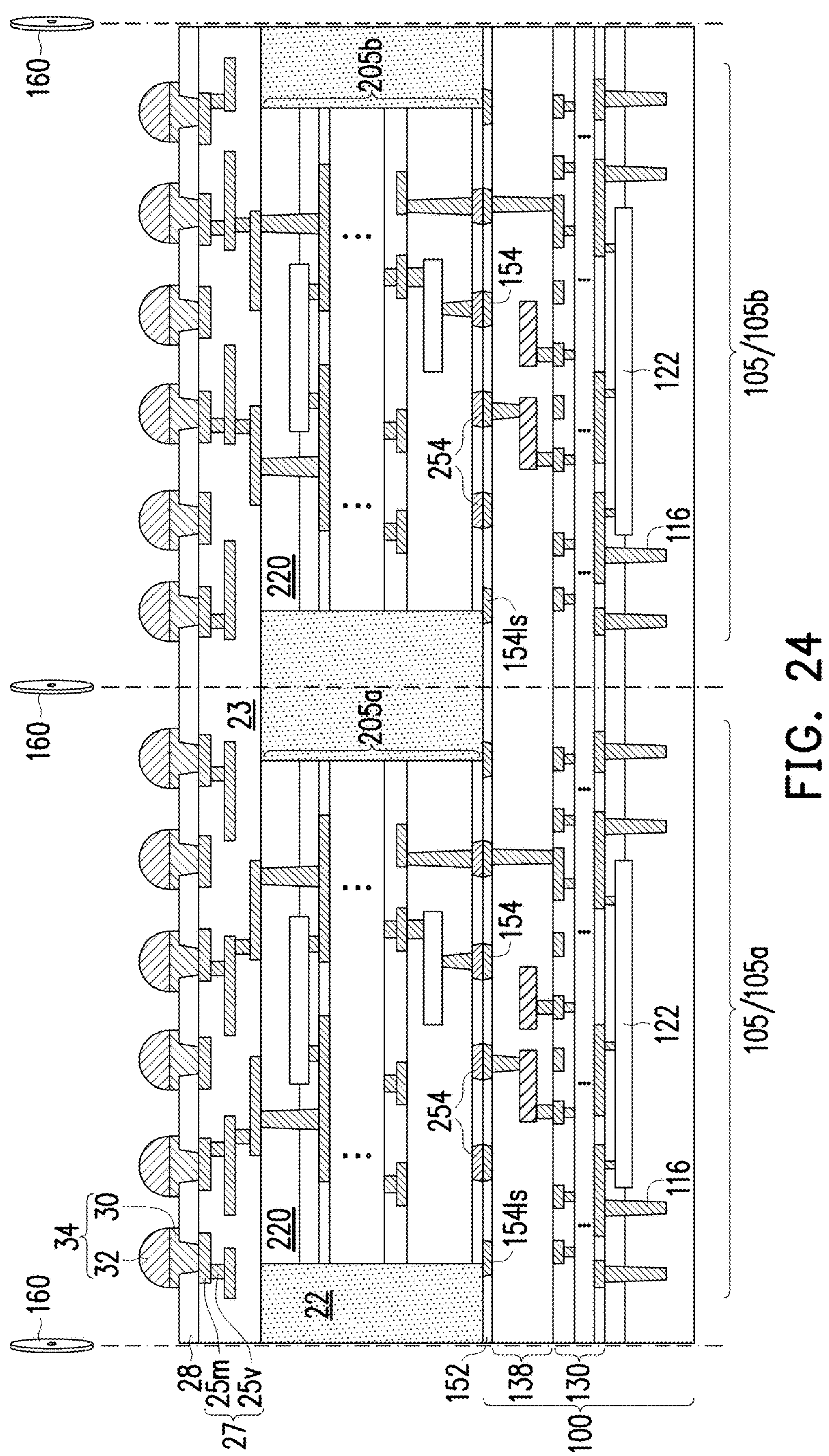

In FIG. 24, a singulation process 160 may be used to singulate the dies 105 and dies 205 from one another. The singulation process 160 may cut, for example through scribe lines between package areas or between die areas. In some embodiments, each of the singulated packages may include multiple dies 105 and/or dies 205.

Figure 25:
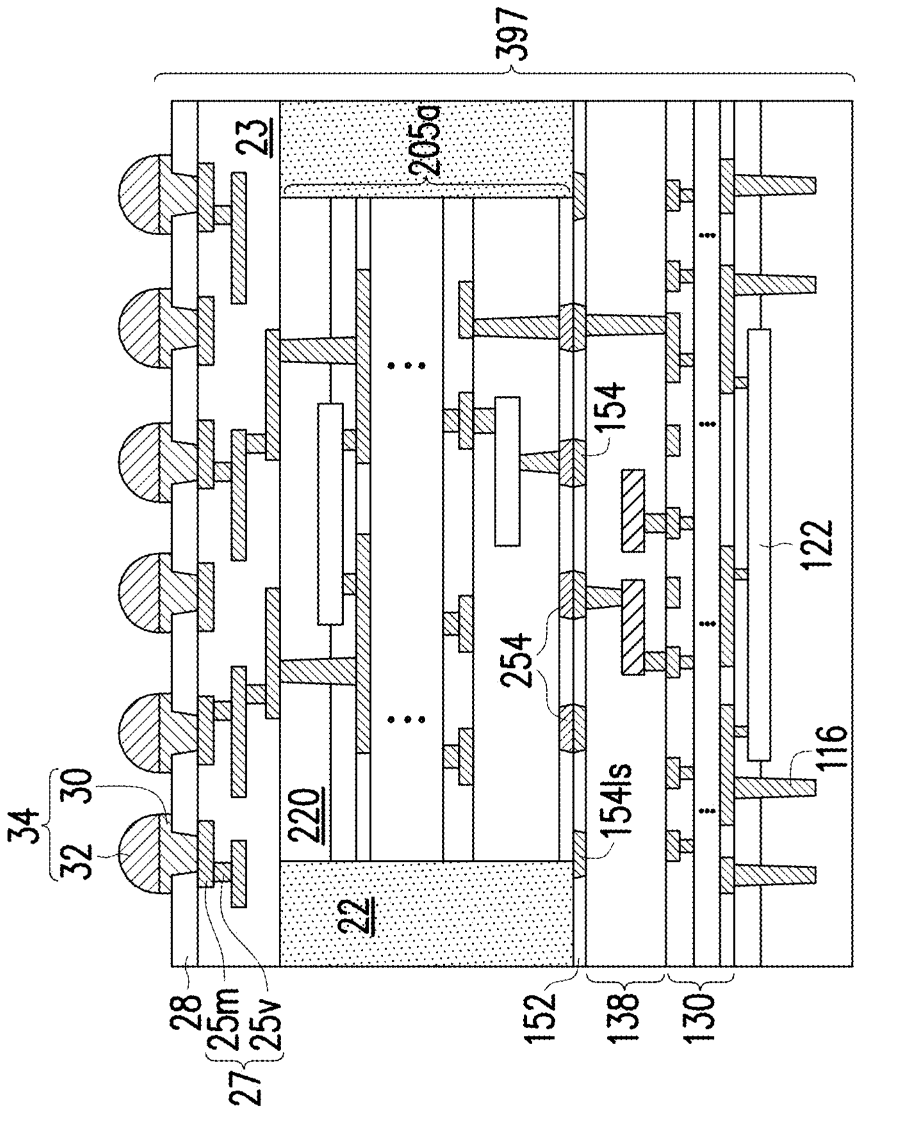

In FIG. 25, the package device 397 includes a second die 205 mounted to a first die 105 using the landing structures 154*ls* as providing increased adhesion over a typical dielectric-to-dielectric fusion bond at the edges and/or corners of the second die 205. The package device 397 may then be mounted to a package substrate 400, similar to that described above with respect to the package device 395 of FIG. 19.

Embodiments achieve advantages by providing, at least in some embodiments, landing structures at the edges of the die attach regions of a first die. The edges and/or corners of a second die may then be attached to the landing structures by a direct bonding process which adjoins the dielectric material of the second die to the conductive material of the landing structures. In some embodiments, a bridge die may be used which has a thickness that is less than the thickness of additionally attached device dies, so that a height-to-width ratio of a gap between the bridge die and the additionally attached device dies may be controlled, based on the thickness of the bridge die, to have a greater width than height. Embodiments including the bridge die having a reduced thickness may also be used in conjunction with the landing structures to achieve better adherence of the bridge die and/or device dies to the die attach regions of the first die.

One embodiment is a method including aligning a bond pad of a second die to a first bond pad metal of a first die, the first die including the first bond pad metal and a second bond pad metal, the second bond pad metal adjacent to the first bond pad metal. The method also includes bonding a second dielectric bond layer of the second die to a first dielectric bond layer of the first die. The method also includes bonding the bond pad of the second die with the first bond pad metal of the first die, the bond pad of the second die interfacing directly with the first bond pad metal. The method also includes adjoining the second dielectric bond layer of the second die to the second bond pad metal of the first die.

In an embodiment, bonding the second dielectric bond layer, bonding the bond pad of the second die, and adjoining the second dielectric bond layer occurs in a same joining process. In an embodiment, the joining process may include: placing the second die on the first die; pressing the bond pad of the second die against the first bond pad metal, the second dielectric bond layer against the first dielectric bond layer, and the second dielectric bond layer against the second bond pad metal; and annealing the combination of the second die and the first die, to interdiffuse a metallic material of the bond pad with the first bond pad metal, to form dielectric-to-dielectric bonds between the second dielectric bond layer and the first dielectric bond layer, and to form chemical bonds between the second dielectric bond layer and the first bond pad metal. In an embodiment, the first bond pad metal is arranged in a first set of bond pads, and the second bond pad metal is arranged in a second set of bond pads. In an embodiment, first bond pads of the first set of bond pads are separated from each other by a first pitch, and second bond pads of the second set of bond pads are separated from each other by the first pitch. In an embodiment, the second bond pad metal protrudes laterally from an edge of the second die. In an embodiment, the bond pad is a first bond pad, the second die is a bridge die, and the method may include: attaching the first die to a carrier; attaching a third die to the carrier; depositing a first encapsulant on the carrier, the first encapsulant laterally surrounding the first die and the third die; forming the first bonding layer over the first encapsulant and over the first die and the third die; forming the first bond pad metal of the first die in the first bonding layer over the first die; forming a third bond pad metal of the third die in the first bonding layer over the third die; bonding a second bond pad of the second die with the third bond pad metal of the third die; and adjoining the second dielectric bond layer of the second die to a fourth bond pad metal of the third die.

In an embodiment, The method may include: bonding a first bond pad of a fourth die to the first bond pad metal of the first die; bonding a first bond pad of a fifth die to the third bond pad metal of the third die, the fourth die laterally separated from the second die by a first distance, the second die having a first thickness, the fourth die and fifth die having a second thickness, the second thickness being 5 to 15 times the first thickness; depositing a second encapsulant over the first encapsulant, over the first die, over the second die, over the third die, over the fourth die, and over the fifth die, the second encapsulant contacting an upper portion of the first die between the second die and the fourth die. In an embodiment, a ratio of the first thickness to the first distance is 1:1 to 1:3.

Another embodiment is a method including attaching a bridge die to a first die and a second die, the bridge die electrically coupling the first die to the second die, the bridge die having a first thickness. The method also includes attaching a third die to the first die and a fourth die to the second die, the bridge die interposed between the third die and the fourth die, the third die having a second thickness, the fourth die having a third thickness, where each of the second thickness and the third thickness are between 5 times and 15 times the first thickness. The method also includes depositing an encapsulant over the bridge die, the first die and the second die to laterally surround the third die, the fourth die, and the bridge die. The method also includes grinding an upper surface of the encapsulant and an upper portion of the third die and the fourth die until each of the second thickness and the third thickness are between 3 times and 10 times the first thickness.

In an embodiment, the method may include forming a dummy support pad at an upper surface of the first die and the second die, where attaching the bridge die may include adjoining a dielectric bonding layer of the bridge die with the dummy support pad. In an embodiment, the dummy support pad extends laterally beyond an edge of the bridge die such that a first portion of the dummy support pad has an interface with the bridge die and a second portion of the dummy support pad is exposed from the bridge die. In an embodiment, the dummy support pad is disposed at a corner of the bridge die, the second portion of the dummy support pad exposed from the bridge die along a first side of the bridge die, a third portion of the dummy support pad exposed from the bridge die along a second side of the bridge die. In an embodiment, the dummy support pad has a linear configuration in a plan view a first line portion of the dummy support pad meeting a second line portion of the dummy support pad intersecting at a corner of the bridge die. In an embodiment, a first distance is a shortest distance between the bridge die and the third die, where a ratio of the first distance to the first thickness is between 3:1 and 1:1. In an embodiment, the first thickness is between 15 μm and 25 μm.

Another embodiment is a package structure including a first die and a second die. The first die may include a first bond pad and a dummy bond structure disposed at a first surface thereof, the first bond pad and dummy bond structure laterally surrounded by a first dielectric bonding layer. The second die may include a second bond pad disposed at a second surface thereof, the second bond pad laterally surrounded by a second dielectric bonding layer, the second bond pad directly bonded to the first bond pad, an interior portion of the second dielectric bonding layer bonded to the first dielectric bonding layer, and an edge portion of the second dielectric bonding layer adjoined to the dummy bond structure.

In an embodiment, the dummy bond structure corresponds to a corner region of the second die, the corner region of the second die contacting the dummy bond structure. In an embodiment, the dummy bond structure may include a first line segment extending along a first edge of the second die and a second line segment extending along a second edge of the second die, the first line segment and the second line segment meeting at the corner region of the second die. In an embodiment, the package structure further includes a third die disposed adjacent the first die and separated from the first die by a first distance; a fourth die attached to the third die; a bridge die attached to both the first die and the third die, wherein the bridge die spans the first distance, a thickness of the bridge die is a first thickness, a thickness of the second die is a second thickness, the second thickness is 3 to 10 times the first thickness; an encapsulant laterally surrounded the second die, the fourth die, and the bridge die, the encapsulant completely filling a space between the bridge die and the second die, the space having a width between 1 and 3 times the first thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations here in without departing from the spirit and scope of the present disclosure.

What is claimed is:

1. A method comprising:

aligning a bond pad of a second die to a first bond pad metal of a first die, the first die including the first bond pad metal and a second bond pad metal, the second bond pad metal adjacent to the first bond pad metal;

bonding a second dielectric bond layer of the second die to a first dielectric bond layer of the first die;

bonding the bond pad of the second die with the first bond pad metal of the first die, the bond pad of the second die interfacing directly with the first bond pad metal; and adjoining the second dielectric bond layer of the second die to the second bond pad metal of the first die, wherein the second bond pad metal of the first die protrudes laterally from an edge of the second die.

2. The method of claim 1, wherein bonding the second dielectric bond layer of the second die, bonding the bond pad of the second die, and adjoining the second dielectric bond layer of the second die occur in a same joining process.

3. The method of claim 2, wherein the joining process comprises:

placing the second die on the first die;

pressing the bond pad of the second die against the first bond pad metal of the first die, the second dielectric bond layer of the second die against the first dielectric bond layer of the first die, and the second dielectric bond layer of the second die against the second bond pad metal of the first die; and annealing the combination of the second die and the first die, to interdiffuse a metallic material of the bond pad of the second die with the first bond pad metal of the first die, to form dielectric-to-dielectric bonds between the second dielectric bond layer of the second die and the first dielectric bond layer of the first die, and to form chemical bonds between the second dielectric bond layer of the second die and the second bond pad metal of the first die.

4. The method of claim 1, wherein the first bond pad metal of the first die is arranged in a first set of bond pads, wherein the second bond pad metal of the first die is arranged in a second set of bond pads.

5. The method of claim 4, wherein first bond pads of the first set of bond pads are separated from each other by a first pitch, wherein second bond pads of the second set of bond pads are separated from each other by the first pitch.

6. The method of claim 1, wherein the bond pad of the second die is a first bond pad, wherein the second die is a bridge die, further comprising:

attaching the first die to a carrier;

attaching a third die to the carrier;

depositing a first encapsulant on the carrier, the first encapsulant laterally surrounding the first die and the third die;

forming the first dielectric bond layer of the first die over the first encapsulant and over the first die and the third die;

forming the first bond pad metal of the first die in the first dielectric bond layer over the first die;

forming a third bond pad metal of the third die in the first dielectric bond layer over the third die;

bonding a second bond pad of the second die with the third bond pad metal of the third die; and adjoining the second dielectric bond layer of the second die to a fourth bond pad metal of the third die.

7. The method of claim 6, further comprising:

bonding a first bond pad of a fourth die to the first bond pad metal of the first die;

bonding a first bond pad of a fifth die to the third bond pad metal of the third die, the fourth die laterally separated from the second die by a first distance, the second die having a first thickness, the fourth die and fifth die having a second thickness, the second thickness being 5 to 15 times the first thickness; and depositing a second encapsulant over the first encapsulant, over the first die, over the second die, over the third die, over the fourth die, and over the fifth die, the second encapsulant contacting an upper portion of the first die between the second die and the fourth die.

8. The method of claim 7, wherein a ratio of the first thickness to the first distance is 1:1 to 1:3.

9. A method comprising:

attaching a bridge die to a first die and a second die, the bridge die electrically coupling the first die to the second die, the bridge die having a first thickness;

attaching a third die to the first die and a fourth die to the second die, the bridge die interposed between the third die and the fourth die, the third die having a second thickness, the fourth die having a third thickness, wherein each of the second thickness and the third thickness are between 5 times and 15 times the first thickness;

depositing an encapsulant over the bridge die, the first die and the second die to laterally surround the third die, the fourth die, and the bridge die; and grinding an upper surface of the encapsulant and an upper portion of the third die and the fourth die until each of the second thickness and the third thickness is between 3 times and 10 times the first thickness.

10. The method of claim 9, further comprising:

forming a dummy support pad at an upper surface of the first die and the second die, wherein attaching the bridge die comprises adjoining a dielectric bonding layer of the bridge die with the dummy support pad.

11. The method of claim 10, wherein the dummy support pad extends laterally beyond an edge of the bridge die such that a first portion of the dummy support pad has an interface with the bridge die and a second portion of the dummy support pad is exposed from the bridge die.

12. The method of claim 11, wherein the dummy support pad is disposed at a corner of the bridge die, the second portion of the dummy support pad is exposed from the bridge die along a first side of the bridge die, a third portion of the dummy support pad exposed from the bridge die along a second side of the bridge die.

13. The method of claim 10, wherein the dummy support pad has a linear configuration in a plan view, a first line portion of the dummy support pad meeting a second line portion of the dummy support pad intersecting at a corner of the bridge die.

14. The method of claim 9, wherein a first distance is a shortest distance between the bridge die and the third die, wherein a ratio of the first distance to the first thickness is between 3:1 and 1:1.

15. The method of claim 9, wherein the first thickness is between 15 μm and 25 μm.

16. A package structure comprising:

a first die, the first die comprising a first bond pad and a dummy bond structure disposed at a first surface thereof, the first bond pad and the dummy bond structure laterally surrounded by a first dielectric bonding layer; and a second die, the second die comprising a second bond pad disposed at a second surface thereof, the second bond pad laterally surrounded by a second dielectric bonding layer, the second bond pad directly bonded to the first bond pad, an interior portion of the second dielectric bonding layer bonded to the first dielectric bonding layer, and an edge of the second dielectric bonding layer partially overlaps the dummy bond structure.

17. The package structure of claim 16, wherein the dummy bond structure corresponds to a corner of the second die, the corner of the second die contacting the dummy bond structure.

18. The package structure of claim 17, wherein the dummy bond structure comprises a first line segment extending along a first edge of the second die and a second line segment extending along a second edge of the second die, the first line segment and the second line segment meeting at the corner of the second die.

19. The package structure of claim 16, further comprising:

a third die disposed adjacent the first die and separated from the first die by a first distance;

a fourth die attached to the third die;

a bridge die attached to both the first die and the third die, the bridge die spanning the first distance, a thickness of the bridge die being a first thickness, a thickness of the second die being a second thickness, wherein the second thickness is 3 to 10 times the first thickness; and an encapsulant laterally surrounding the second die, the fourth die, and the bridge die, the encapsulant completely filling a space between the bridge die and the second die, the space having a width between 1 and 3 times the first thickness.

20. The method of claim 1, wherein a corner of the second die partially overlaps the second bond pad metal of the first die in a plan view.

* * * * *